(12) United States Patent
Tanaka et al.

(10) Patent No.: US 9,046,228 B2
(45) Date of Patent: Jun. 2, 2015

(54) LIGHT-EMITTING DEVICE FOR EMITTING LIGHT OF MULTIPLE COLOR TEMPERATURES

(71) Applicant: PANASONIC CORPORATION, Osaka (JP)

(72) Inventors: Kenichiro Tanaka, Osaka (JP); Tomoyuki Nakano, Niigata (JP); Yoshiyuki Nakano, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 76 days.

(21) Appl. No.: 13/853,347

(22) Filed: Mar. 29, 2013

(65) Prior Publication Data

US 2013/0265757 A1 Oct. 10, 2013

(30) Foreign Application Priority Data

Apr. 6, 2012 (JP) .................................. 2012-087105

(51) Int. Cl.
| | |
|---|---|
| *F21K 99/00* | (2010.01) |
| *F21V 13/04* | (2006.01) |
| *H05B 33/14* | (2006.01) |
| *B60Q 1/04* | (2006.01) |
| *F21S 8/10* | (2006.01) |
| *H01L 25/075* | (2006.01) |
| *H01L 33/50* | (2010.01) |

(52) U.S. Cl.
CPC ............... *F21K 99/00* (2013.01); *H01L 33/504* (2013.01); *B60Q 1/04* (2013.01); *F21V 13/04* (2013.01); *F21S 48/1127* (2013.01); *F21S 48/1159* (2013.01); *H01L 25/0753* (2013.01); *H01L 33/505* (2013.01); *H01L 2924/0002* (2013.01)

(58) Field of Classification Search
CPC ............ B60Q 1/04; B60Q 1/24; F21K 99/00; F21S 48/1127; F21S 48/1159; F21S 48/00; F21S 48/10
USPC .................... 362/544, 545, 465; 313/501, 502
See application file for complete search history.

(56) References Cited

U.S. PATENT DOCUMENTS

| | | | | |
|---|---|---|---|---|
| 6,406,172 | B1 * | 6/2002 | Harbers et al. ................. | 362/544 |
| 6,676,282 | B2 * | 1/2004 | Begemann et al. ........... | 362/543 |

(Continued)

FOREIGN PATENT DOCUMENTS

| | | |
|---|---|---|
| DE | 102005022832 | 11/2006 |
| DE | 102009018568 | 12/2009 |

(Continued)

OTHER PUBLICATIONS

Extended European Search Report (EESR) from European Patent Office (EPO) in European Patent Application No. 13162246.6, dated Aug. 27, 2014.

*Primary Examiner* — Sikha Roy
(74) *Attorney, Agent, or Firm* — Greenblum & Bernstein, P.L.C.

(57) ABSTRACT

A light-emitting unit includes a mounting substrate, and a first light-emitting portion disposed on the mounting substrate and emits light of a first color temperature to irradiate a first irradiation area, and second light-emitting portions each disposed on the mounting substrate and emits light of a second color temperature to irradiate a second irradiation area. The second irradiation area overlaps part of the first irradiation area and includes a region surrounding the first irradiation area.

11 Claims, 20 Drawing Sheets

(56) References Cited

U.S. PATENT DOCUMENTS

| | | |
|---|---|---|
| 7,703,961 B2 | 4/2010 | Yatsuda et al. |
| 7,758,221 B2* | 7/2010 | Weijers .................. 362/545 |
| 7,959,337 B2* | 6/2011 | Nakamura et al. ............ 362/543 |
| 2006/0285341 A1 | 12/2006 | Yatsuda et al. |
| 2009/0046453 A1 | 2/2009 | Kramer |
| 2010/0001297 A1 | 1/2010 | Takashima et al. |
| 2010/0128463 A1 | 5/2010 | Kim et al. |
| 2010/0163891 A1 | 7/2010 | Ku et al. |
| 2010/0201248 A1 | 8/2010 | Harada et al. |
| 2012/0038291 A1* | 2/2012 | Hasnain ..................... 315/294 |
| 2012/0051075 A1* | 3/2012 | Harada et al. ............... 362/510 |
| 2012/0168777 A1* | 7/2012 | Lai et al. .................... 257/88 |

FOREIGN PATENT DOCUMENTS

| | | |
|---|---|---|
| EP | 2290279 | 3/2011 |
| EP | 2546875 | 1/2013 |
| JP | 2005-053381 | 3/2005 |
| JP | 2006-351369 | 12/2006 |
| JP | 2007-265818 | 10/2007 |
| JP | 2009-235860 | 10/2009 |
| JP | 2010-118531 | 5/2010 |
| JP | 2010-129543 | 6/2010 |
| JP | 2012-022986 | 2/2012 |
| JP | 2012-028189 | 2/2012 |

* cited by examiner

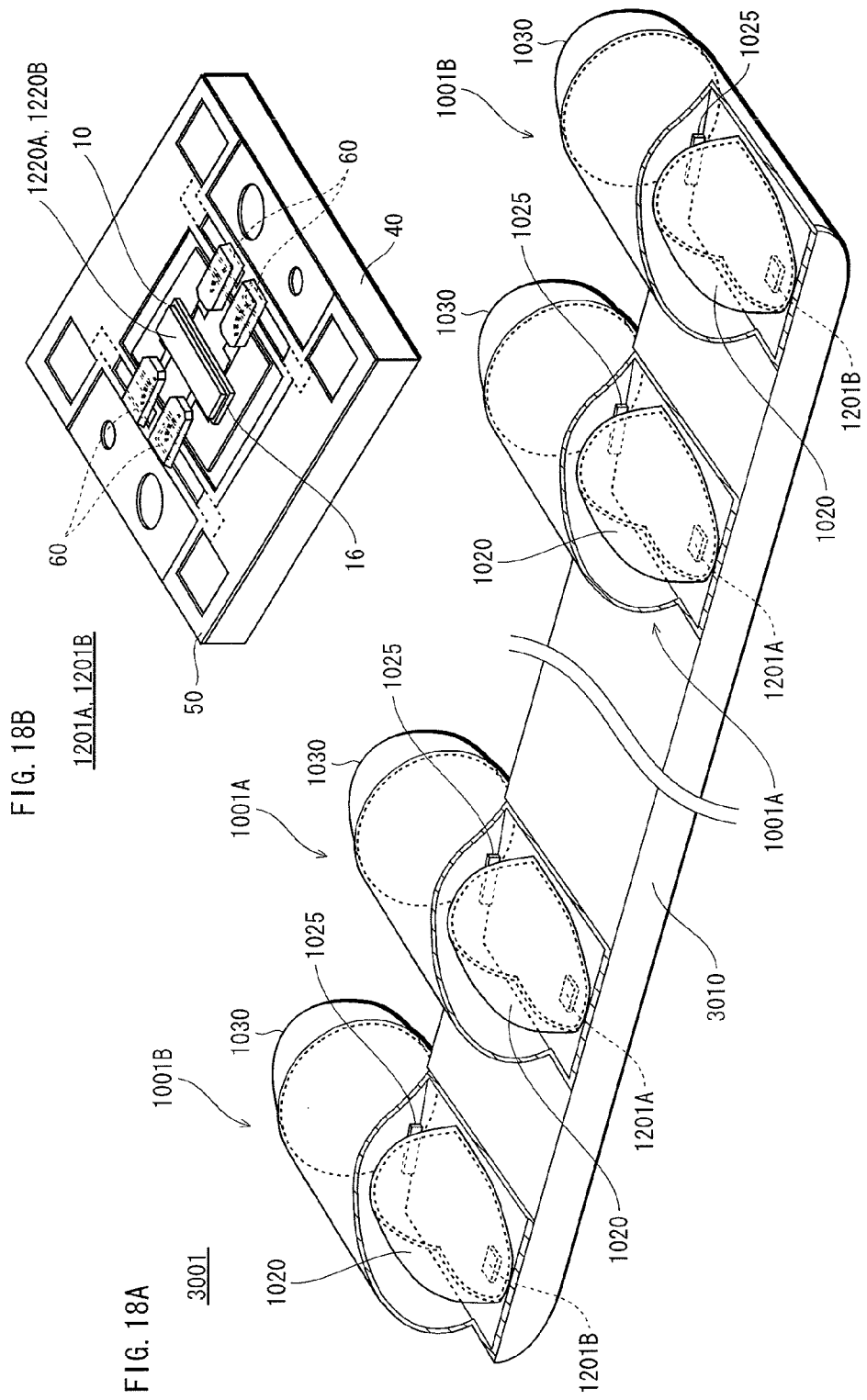

LIGHT-EMITTING DEVICE FOR EMITTING LIGHT OF MULTIPLE COLOR TEMPERATURES

TECHNICAL FIELD

The present disclosure relates to light-emitting devices and in particular to a technique for improving visibility.

BACKGROUND ART

In recent years, light-emitting portions using semiconductor light-emitting elements, such as light-emitting diode (LED) chips, have been suggested for the application in vehicle headlamps (see Patent Literature 1).

The light-emitting device described in Patent Literature 1 has a light-emitting portion that includes an LED chip and a wavelength converter encapsulating the LED chip. The wavelength converter is made of a transmissive material containing yellow phosphor particles. The wavelength converter converts part of blue light emitted from the LED chip into yellow light. On the other hand, the rest of blue light emitted from the LED chip passes through the wavelength converter without being converted into yellow light. As a result, the light-emitter emits white light results from the mixture of blue light and yellow light.

FIG. 20 is a view explaining the light distribution characteristics of such a light-emitting device.

A light-emitting device 2001 has a light-emitting portion 2020 that includes: an LED chip 2022 mounted on a mounting substrate 2011; and a wavelength converter 2024 having a dome shape and encapsulating the LED chip 2022. The LED chip 2022 is a so-called a blue LED that emits blue light. The wavelength converter 2024 is made of a transmissive material (such as silicone resin) containing yellow phosphor. The length of optical path that light emitted from the LED chip 2022 travels within the wavelength converter 2024 is substantially constant irrespective of the emission directions. With this arrangement, the color temperature of light emerged from the light-emitter 2020 is all uniform irrespective of the emission directions.

As shown in the portion (a) of FIG. 20, suppose that the screen SC is disposed at a location away from the light-emitting device 2001 in the direction of the optical axis J (in the light emission direction) of the light-emitting device 2001 such that the surface of the screen SC is perpendicular to the optical axis J. Then, as shown in the portion (b) of FIG. 20, light emitted from the light-emitting device 2001 irradiates the irradiation area SA31 (hatched area in the figure) on the surface of the screen SC.

CITATION LIST

Patent Literature

[Patent Literature 1]
Japanese Patent Application Publication No. 2010-118531

SUMMARY

Unfortunately, in the irradiation area SA31, the peripheral part is lower in brightness than in the central part. Yet, when the light-emitting device 2001 is used in the applications for vehicle headlamps, what matters is the visibility of an object moving from the side of the road toward the center. Therefore, when the irradiation area SA31 is aimed at the center of a road, the visibility of an object located in the peripheral part of the irradiation area SA3, which corresponds to a side of the road, needs to be improved. In other words, there is a demand for increased visibility of the lower-brightness peripheral part of the irradiation area SA31.

In view of the above, one non-limiting and exemplary embodiment provides a light-emitting device that ensures increased visibility of an object located in the irradiation area.

In one general aspect, the techniques disclosed here feature a light-emitting device that includes: a substrate; a first light-emitting portion disposed on the substrate and configured to emit light of a first color temperature to irradiate a first irradiation area of a target; and a second light-emitting portion disposed on the substrate and configured to emit light of a second color temperature to irradiate a second irradiation area of the target. The second color temperature is higher than the first color temperature. The second irradiation area partially overlaps the first irradiation area and includes at least part of a region surrounding the first irradiation area.

The visibility of an object located in a low-brightness irradiation area (dark field of the irradiation area) differs depending on the color temperature of light irradiating the irradiation area. As the generally-known Purkinje effect introduces, the visibility of an object appearing in a dark field of an irradiation area increases with an increasing color temperature of light irradiating the irradiation area.

According to the above configuration, light of a second color temperature that is higher than a first color temperature is distributed to a second irradiation area that includes a region surrounding the first irradiation area. Hence, due to the Purkinje effect mentioned above, the visibility of an object appearing in part of the second irradiation area SA2, the part not overlapping the first irradiation area SA1.

The general and specific aspect may be implemented using a manufacturing method. Additional benefits and advantages of the disclosed embodiments will be apparent from the specification and figures. The benefits and/or advantages may be individually provided by the various embodiments and features of the specification and drawings disclosure, and need not all be provided in order to obtain one or more of the same.

BRIEF DESCRIPTION OF DRAWINGS

FIG. 18A is a partly-broken oblique view and FIG. 18B is an oblique view of light-emitting devices included in an illumination system according to yet another modification.

DETAILED DESCRIPTION

Embodiment 1

Figure 1:
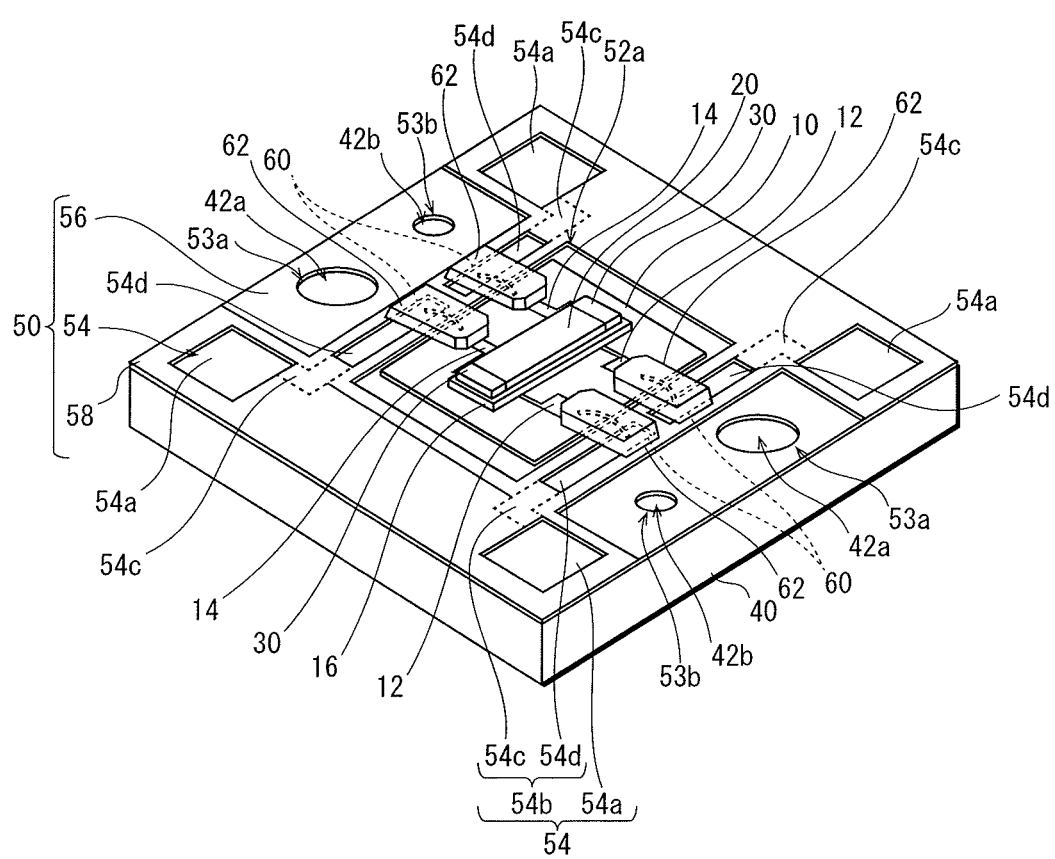
FIG. 1 is an oblique view of a light-emitting device according to Embodiment 1.
Figure 2A:
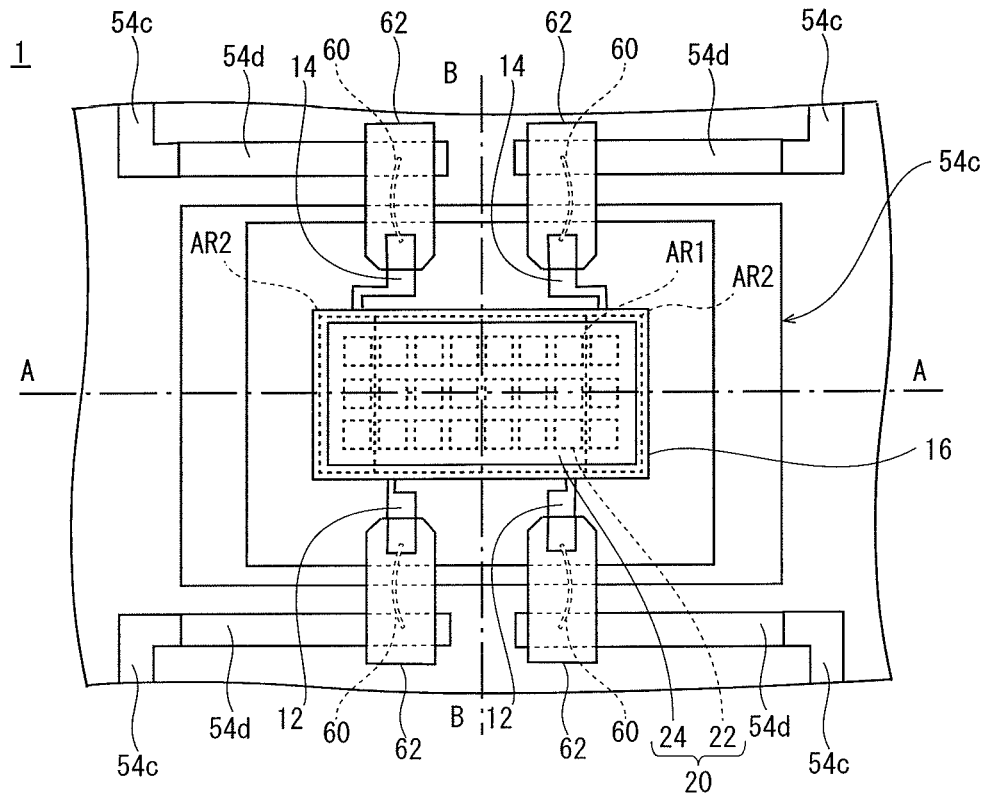
FIG. 2A is a plan view showing important parts of the light-emitting device according to Embodiment 1.
Figure 2B:
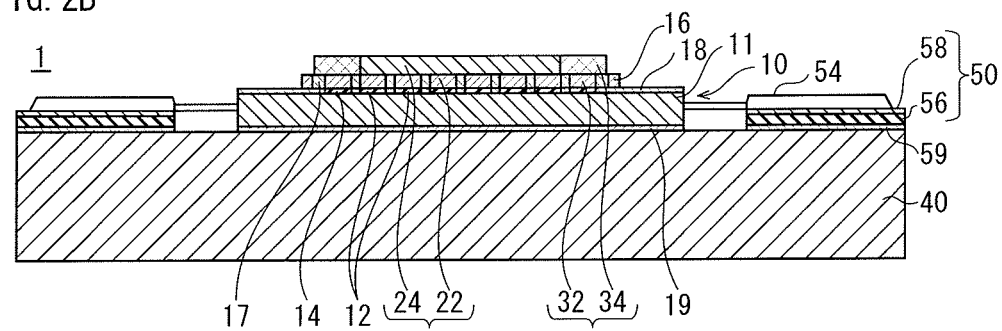
FIG. 2B is a sectional view taken along the line A-A of FIG. 2A.
Figure 2C:
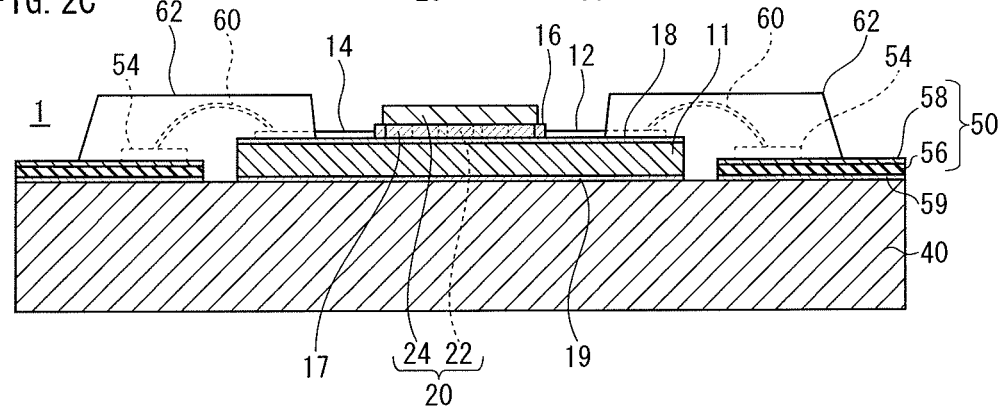
FIG. 2C is a sectional view taken along the line B-B of FIG. 2A.
Figure 3:
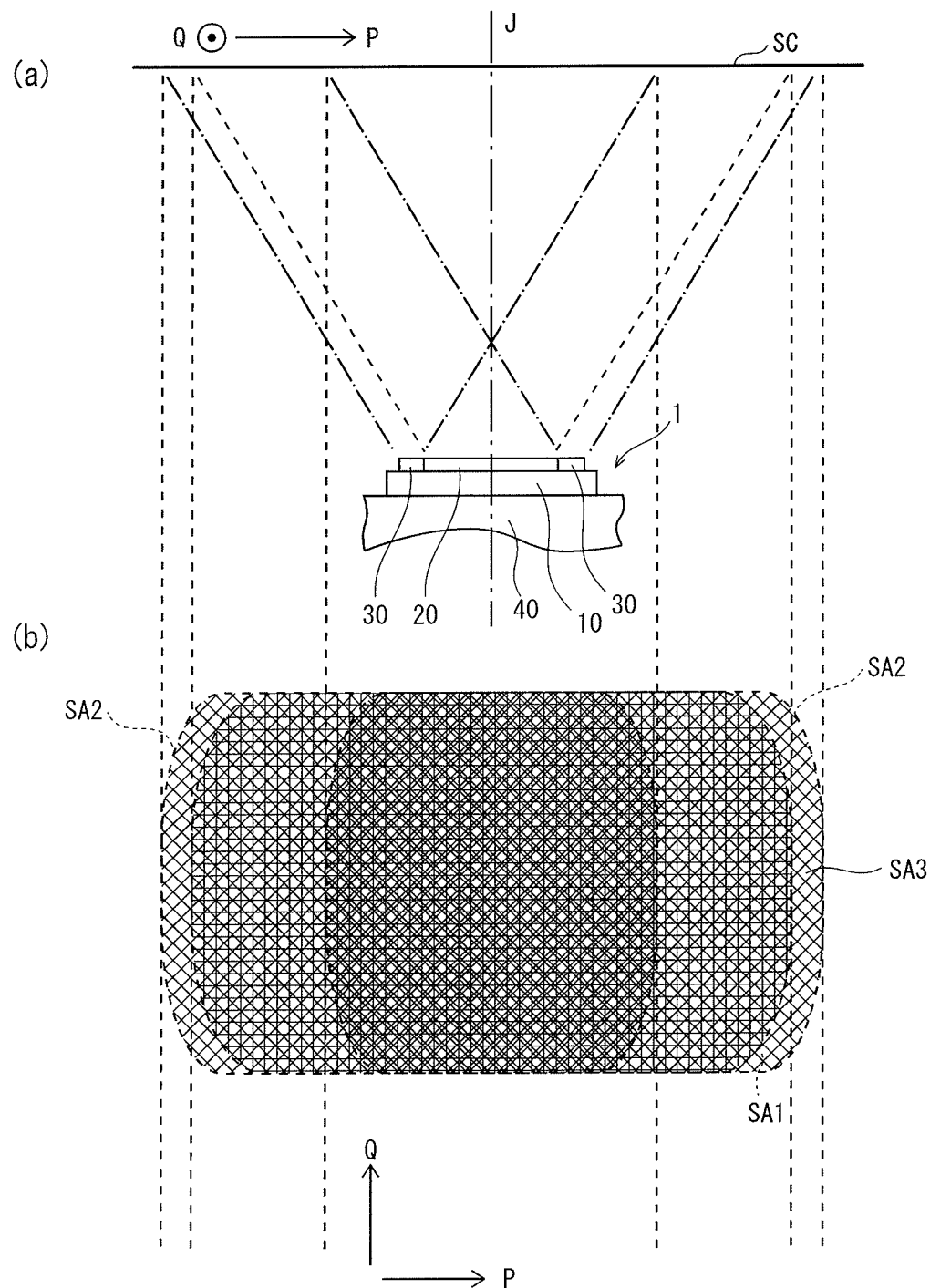
FIG. 3 is a view explaining the light distribution characteristics of the light-emitting device according to Embodiment 1.

The following describes a light-emitting unit 1 according to Embodiment 1, with reference to FIGS. 1-3.
<1> Structure FIG. 1 is an oblique view of the light-emitting unit 1 according to Embodiment 1. FIG. 2A is a plan view showing important parts of the light-emitting unit 1, FIG. 2B is a sectional view taken along the line A-A of FIG. 2A, and FIG. 2C is a sectional view taken along the line B-B of FIG. 2A.

As shown in FIG. 1, the light-emitting unit 1 is provided with a light-emitting device (LED module), a heat transfer plate 40, and a circuit board 50. The light-emitting device is provided with a mounting substrate 10, a first light-emitting portion 20, and two second light emitting portions 30.
<1-1> Heart Transfer Plate The heat transfer plate 40 is fixed, for example, to a lighting fixture and conducts heat from the first light-emitting portions 20 and the second light-emitting portions 30 to the lighting fixture in order to suppress temperature rise of the light-emitting portion 20 and the respective light-emitting portions 30. By suppressing the temperature rise, decrease in luminous efficiency of the first light-emitting portion 20 and the second light-emitting portions 30 is suppressed.

As shown in FIG. 1, the heat transfer plate 40 has a rectangular shape, and the mounting substrate 10 is fixed on one of the main surfaces opposing in the thickness direction. The heat transfer plate 40 has two pairs of through holes 42a and 42b. In plan view, the through holes 42a and 42b in each pair are mutually different in size and located along one of two sides of the heat transfer plate 40 opposed across the central part. Each through hole 42a is for insertion of a screw for securing the light-emitting unit 1 to the body of an illumination apparatus on which the light-emitting unit 1 is to be mounted. Each through hole 42b is for determining the proper position of the light-emitting unit 1 relative to the body of the illumination apparatus at the time of manufacturing. More specifically, the illumination apparatus has mounting marks formed in advance on the body to indicate the proper mounting position for the light-emitting unit 1. Then, the light-emitting unit 1 is placed in the state that the mounting marks are visible through the respective through holes 42b when the heat transfer plate 40 is seen from the main surface on which the mounting substrate 10 is placed. In this state, the screws are passed through the respective through holes 42a and screwed into the threaded holes formed in the body of the illumination apparatus. As a result, the light-emitting unit 1 is secured at the desired position on the body of the illumination apparatus.
<1-2> Circuit Board The circuit board 50 has a wiring pattern 54 for feeding power to the first light-emitting portion 20 and the second light-emitting portions 30.

As shown in FIG. 1, the circuit board 50 includes: a rectangular insulating substrate 56; the wiring pattern 54 on a main surface of the insulating substrate 56 facing away from the heat transfer plate 40; and a reflective film 58 coating part of the main surface of the insulating substrate 56.

The insulating substrate 56 is in the shape of a rectangular plate and has a centrally located window 52a having a rectangular shape in plan view. Also, the insulating plate 56 has through holes 53a and 53b at locations corresponding to the through holes 42a and 42b of the heat transfer plate 40. The insulating substrate 56 is made of an insulating material examples of which include glass epoxy resin and bismaleimide-triazine resin.

The wiring pattern 54 includes four electrode pads 54a located one at each of the four corners of the circuit board 50 and each having a rectangular shape in plan view. The wiring pattern 54 also includes four extensions 54b each extending from one of the electrode pads 54a to a region surrounding the window 52a. Each extension 54b has a first portion 54c that is coated with the reflective film 58 and a second portion 54d that is exposed without being coated with the reflective film 58. The wiring pattern 54 is formed by laminating an Au film on a Cu film by flash plating. Note that the wiring pattern 54 is not limited to a laminate of a Cu film and an Au film. Alternatively, the wiring pattern 54 may be made solely of a Cu film or an Al film.

The reflective film 58 reflects light emitted from the first light-emitting portion 20 and the second light-emitting portions 30. In one example, the reflective film 58 is made from a resist material containing inorganic material, such as $BaSO_4$ usable as white pigments.

As shown in FIGS. 2B and 2C, the circuit board 50 is fixed to the heat transfer plate 40 via an adhesive sheet 59. In one example, the adhesive sheet 59 is a sheet made of epoxy resin containing silicone rubber, alumina, silica, or the like dispersed therein.
<1-3> Mounting Substrate The mounting substrate 10 is a substrate on which a plurality of LED chips are mounted. The plurality of LED chips include LED chips 22 constituting part of the first light-emitting portion 20 and LED chips 32 constituting part of the respective second light-emitting portions 30 (see FIGS. 2A, 2B, and 2C). As shown in FIG. 1, the mounting substrate 10 as a whole has the general shape of a rectangular plate. The mounting substrate 10 includes: an insulating substrate 11 also having the shape of a rectangular plate; a pair of conductor patterns 12; a pair of conductor patterns 14; and a reflective film 18 coating the entire upper surface of the insulating substrate 11 except the conductor patterns 12 and 14.

The conductor patterns 12 and 14 on the mounting substrate 10 are electrically connected via metal wires 60 to the respective second portions 54d of the wiring pattern 54 on the circuit board 50. The respective metal wires 60 are sealed by seals 62. The metal wires 60 are made from a material, such as Au or Al. In addition, the seals 62 are made from an electrical insulating resin material, such as silicone resin.

The mounting substrate 10 is made from aluminum nitride, which is a material having high thermal conductivity and good electrical insulation. Note that the material for the mounting substrate 10 is not limited to aluminum nitride. For example, the mounting substrate 10 may be made from a highly insulating material, such as silicon oxide or from germanium, silicon, silicon nitride, or alumina ceramics. The conductor patterns 12 and 14 are made from a metal material, such as an alloy containing Sn, Ag, or Cu. The material for the conductor patterns 12 and 14 are not limited to a metal material. For example, the conductor patterns 12 and 14 may be made from a conductive material, such as polysilicon. The reflective film 18 reflects light emitted from the first light-emitting portion 20 and the second light-emitting portions 30. A frame 16 is made from a resin material, such as a white polycarbonate resin.

Note that part of light emitted from the LED chips 22 and 32 disposed inside the frame 16 is reflected by the reflective film 18 or by the inner walls of the frame 16.

As shown in FIGS. 2B and 2C, the mounting substrate 10 is fixed to the heat transfer plate 40 via an adhesive sheet 19. In one example, the adhesive sheet 19 is a sheet made from epoxy resin containing silicone rubber, alumina, silica, or the like dispersed therein.

<1-4> First Light-Emitting Portion

The first light-emitting portion 20 emits light with a first color temperature. The light of the first color temperature refers to white light of color temperatures ranging from 2000 K to 5500 K. In this embodiment, the first color temperature is 3000 K, for example.

As shown in FIG. 2A, the first light-emitting portion 20 is located in the first mounting area AR1 on the mounting substrate 10.

The first light-emitting portion 20 includes: the plurality of LED chips 22 (18 LED chips in the example shown in FIG. 2A) located in the first mounting area AR1 on the mounting substrate 10; and a first wavelength converter 24 encapsulating the 18 LED chips 22.

The LED chips 22 emit light in a first wavelength range (of 400 nm to 480 nm) (hereinafter, light in the first wavelength range is simply referred to as "blue light"). Examples of the LED chips 22 include ones having the following layers laminated in sequence on a semiconductor substrate made of sapphire or the like: a layer of n-type gallium nitride-based compound semiconductor; a light-emitting layer formed from indium-containing gallium nitride-based compound semiconductor; and a layer of p-type gallium nitride-based compound semiconductor. For example, each LED chip 22 has the shape of a rectangular plate that is about 1 mm on a side and about 100 μm in thickness. However, the dimensions are not limited to this example.

Note, in addition, that each LED chip 22 has an anode and a cathode both on the main surface of the layer of p-type gallium nitride-based compound semiconductor. The LED chips 22 are mounted on part of the respective conductor patterns 12 formed on the mounting substrate 10, by flip-chip bonding using metal bumps (not illustrated), such as Au bumps.

The first wavelength converter 24 converts part of blue light emitted from the LED chips 22 to light in a second wavelength range (of 545 nm to 595 nm, and at 560 nm, for example in Embodiment 1) that is of wavelengths longer than the blue light wavelength range (hereinafter, light in the second wavelength range is simply referred to as "yellow light"). More specifically, the first wavelength converter 24 is a rectangular plate made of transmissive base material containing yellow phosphor dispersed therein. The yellow phosphor absorbs blue light emitted from the LED chip 22 and radiates yellow light. For example, the yellow phosphor is formed from silicate phosphor, such as $(Sr,Ba)_2SiO_4:Eu^{2+}$ or $Sr_3SiO_5:Eu^{2+}$. However, the yellow phosphor is not limited to the silicate-based phosphor. Other suitable examples include: garnet phosphors, such as $(Y,Gd)_3Al_5O_{12}:Ce^{3+}$, $Y_3Al_5O_{12}:Ce^{3+}$, $Y_3Al_5O_{12}:Ce^{3+},Pr^{3+}$, and $Tb_3Al_5O_{12}:Ce^{3+}$, thiogallate phosphor which is sulfide phosphor, such as $CaGa_2S_4:Eu^{2+}$, α-sialon phosphor, such as $Ca\text{-}\alpha\text{-}SiAlON:Eu^{2+}$, $(0.75(Ca_{0.9}Eu_{0.1})O.2.25AlN.3.25Si_3N_4:Eu^{2+}$, $Ca_{1.5}Al_3Si_9N_{16}:Eu^{2+}$ or the like), oxynitride phosphor, such as $Ba_3Si_6O_{12}N_2:Eu^{2+}$, nitride phosphor, such as $(Ca,Sr,Ba)AlSiN_3:Eu^{2+}$.

The transmissive base is made from a transmissive material, such as silicone resin, for example. Note that the transmissive material is not limited to silicone resin and may alternatively be fluororesin, epoxy/silicone hybrid resin, urea resin, and so on.

The first light-emitting portion 20 emits light of the first color temperature, which results from mixture of blue light and yellow light having passed through the first wavelength converter 24.

<1-5> Second Light-Emitting Portion

The second light-emitting portions 30 emit light of a second color temperature that is higher than the first color temperature. Light of the second color temperature refers to white light of a color temperature ranging from higher than 5500 K to 20000 K or lower. In the present embodiment, the second color temperature is 8000 K, for example.

As shown in FIG. 2A, each second light-emitting portion 30 is located in a second mounting area AR2 on the mounting substrate 10. The respective second mounting areas AR2 are located in the region surrounding the first mounting area AR1 and on the sides of the first mounting area AR1. The sides of the first mounting area AR1 are opposed to each other so as to have the central part of the first mounting area AR1 inbetween. Each second light-emitting portion 30 includes: the plurality of LED chips 32 (three LED chips in the example shown in FIG. 2A) located in the first mounting area AR2 on the mounting substrate 10; and a second wavelength converter 34 encapsulating the three LED chips 22. The individual LED chips 32 are identical to LED chips 22 in structure.

The second wavelength converter 34 converts part of blue light emitted from the LED chips 32 to light in a third wavelength range (of 500 nm to 540 nm and, for example, at 530 nm in the present embodiment) that is longer than the blue wavelength range and shorter than the yellow wavelength range (hereinafter, light in the second wavelength range is simply referred to as "green light"). More specifically, the second wavelength converter 34 is a rectangular plate made of transmissive base material containing green phosphor dispersed therein. The green phosphor absorbs blue light emitted from the LED chip 32 and radiates green light. Examples of the green phosphors include aluminate phosphors, such as $BaMgAl_{10}O_{17}:Eu^{2+},Mn^{2+}$, $(Ba,Sr,Ca)Al_2O_4:Eu^{2+}$, and (Ba, $Sr_2SiO_4:Eu^{2+}$. Note, however, that the suitable green phosphors are not limited to aluminate phosphors. Other examples include α-sialon phosphors, such as $Sr_{1.5}Al_3Si_9N_{16}:Eu^{2+}$, and Ca-α-SiAlON:Yb$^{2+}$, β-sialon phosphors, such as $\beta$-$Si_3N_4:Eu^{2+}$, oxynitride phosphors, such as $Ba_3Si_6O_{12}N_2$: Eu$^{2+}$, oxo-nitridosilicates, such as $(Ba,Sr,Ca)Si_2O_2N_2:Eu^{2+}$, oxo-nitridoaluminosilicates, such as $(Ba,Sr,Ca)_2Si_4AlON_7$: $Ce^{3+}$, and $(Ba,Sr,Ca)Al_{2-x}Si_xO_{4-x}N_x:Eu^{2+}$, where (0<x<2), nitridosilicate, which is a type of nitridosilicate phosphors, such as $(Ba,Sr,Ca)_2Si_5N_8:Ce^{3+}$, thiogallate, which is a type of sulfide phosphors, such as $SrGa_2S_4:Eu^{2+}$, and garnet phosphors, such as $Ca_3Sc_2Si_3O_{12}:Ce^{3+}$, $BaY_2SiAl_4O_{12}:Ce3^+$, and $Y_3(Al,Ga)_5O_{12}:Ce^{3+}$, and oxide phosphors, such as $CaSc_2O_4:Ce^{3+}$.

In addition, examples of the base include a silicone resin, similarly to the first wavelength converter 24. The content of phosphor in the second wavelength converter 34 is smaller than that in the first wavelength converter 24. Hence, the rate of blue light conversion by the second wavelength converter 34 is lower than the rate of blue light conversion by the first wavelength converter 24.

The second light-emitting portion 30 emits light of the second color temperature, which results from mixture of blue light and green light having passed through the second wavelength converter 34. In addition, since the rate of blue light conversion by the second wavelength converter 34 is lower than the rate of blue light conversion by the first wavelength converter 24, the second light-emitting portion 30 emits more bluish light, i.e., of the higher color temperature, as compared to light emitted through the first wavelength converter 24.

The first light-emitting portion 20 and the second light-emitting portions 30 are disposed generally centrally of the mounting substrate 10. The optical axes of the first light-emitting portion 20 and the second light-emitting portions 30 are all parallel. The rectangular frame 16 is disposed on the mounting substrate 10 to surround the first light-emitting portion 20 as well as the second light-emitting portions 30 along the region surrounding the first light-emitting portion 20 and the second light-emitting portions 30.

That is, there is a space surrounded by the frame 16, the first wavelength converter 24, the second wavelength converters 34, and the mounting substrate 10. Within this space, an optical component 17 is disposed to fill the gaps between the LED chips 22 and 32. The optical component 17 is made from a transmissive material, such as silicone resin.

The number of LED chips 32 that constitutes part of each second light-emitting portion 30 may be such that one LED chip 32 is provided for each three LED chips 22, which constitute part of the first light-emitting portion 20. The total number of LED chips 22 and 32 is preferably 50 or so at maximum.

In addition, the first wavelength converter 24 of the first light-emitting portion 20 as well as the second wavelength converter 34 of the second light-emitting portion 30 may contain both green phosphor and orange phosphor. In this case, the first wavelength converter 24 and the second wavelength converter 34 are configured to differ in the respective ratios of contents of green phosphor and orange phosphor, so that the first light-emitting portion 20 and the second light-emitting portion 30 emit light of mutually different color temperatures. One example of the orange phosphor is silicate phosphor, such as $(Sr,Ca)_2SiO_4:Eu^{2+}$. Note, however, that the orange phosphor is not limited to silicate phosphor and other suitable examples include garnet phosphors, such as $Gd_3Al_5O_{12}:Ce^{3+}$, and α-sialon phosphors, such as Ca-α-SiAlON:Eu$^{2+}$.

Suppose, for example, that the color temperature of light emitted by the first light-emitting portion 20 needs to be 3000 K. In this case, provided that the green phosphor and the orange phosphor are both silicate-based phosphors, then the first wavelength converter 24 contains the green phosphor and the orange phosphor at the 48:52 ratio. In addition, the mixture of the green phosphor and the orange phosphor is disposed in a dimethyl silicone resin at the concentration of 31% by weight. This achieves the desired color temperature.

Similarly, suppose, for example, that the color temperature of light emitted by the second light-emitting portion 30 needs to be 8000 K. In this case, provided that the green phosphor and the orange phosphor are both silicate-based phosphors, then the second wavelength converter 34 contains the green phosphor and the orange phosphor at the 80:20 ratio. In addition, the mixture of the green phosphor and the orange phosphor is disposed in a dimethyl silicone resin at the concentration of 20% by weight.

<2> Light Distribution Characteristics

The following describes the light distribution characteristics of the light-emitting unit 1 according to the present embodiment.

FIG. 3 is a view explaining the light distribution characteristics of the light-emitting unit 1. In the portion (a) of FIG. 3, the P-axis direction refers to the direction toward right along the drawing sheet surface, whereas the Q-axis direction refers to the direction perpendicular to the drawing sheet surface and toward the viewer of the figure. In the portion (b) of FIG. 3, the P-axis direction refers to the direction toward right along the drawing sheet surface, whereas the Q-axis direction refers to the upward direction in the figure. In addition, the Q-axis direction matches the direction reverse to the vertical direction (to the downward direction).

As shown in the portion (a) of FIG. 3, suppose that the screen SC is disposed at a location away from the light-emitting unit 1 in the direction of the optical axis J (in the light emission direction) of the light-emitting unit 1 such that the surface of the screen SC is perpendicular to the optical axis J. Then, as the portion (b) of FIG. 3 shows, light emitted from the first light-emitting portion 20 irradiates the first irradiation area SA1 (hatched area with lengthwise and widthwise lines) of the screen SC, whereas light emitted from the second light-emitting portions 30 irradiates the second irradiation areas SA2 (hatched areas with diagonal lines) of the screen SC. Each second irradiation area SA2 partially overlaps the first irradiation area SA1 and includes part of a region surrounding the first irradiation area SA1. Consequently, of each second irradiation area SA2, the part not overlapping the first irradiation area SA1 (hereinafter, such a portion is referred to as the "third irradiation area" SA3) exhibits higher color temperature than that exhibited by the first irradiation area SA1.

The first irradiation area SA1 is longer when measured in the direction along which the first light-emitting portion 20 and the second light-emitting portions 30 are aligned (i.e., in the P-axis direction) than in the vertical direction (Q-axis direction). This is because the light-emitting 1 is disposed such that the direction along which the first light-emitting portion 20 and the second light-emitting portions 30 are aligned is perpendicular to the optical axis J as well as to the vertical direction. The shape of the first light-emitting portion 20 affects the shape of the first irradiation area SA1.

Within the first irradiation area SA1 and the second irradiation areas SA2, the distance from the light-emitting unit 1 is shortest at the central part of the first irradiation area SA1 and relatively longer at the peripheral part of the first irradiation area SA1 and at the third irradiation areas SA3. With respect to the brightness within the first irradiation area SA1 and the second irradiation areas SA2, the brightness is lower generally in proportion to the square of the distance to the light-emitting unit 1. Hence, the brightness is lower in the peripheral part of the first irradiation area SA1 and in the third irradiation areas SA3 as compared with the brightness in the central part of the first irradiation area SA1.

To the human eye, in well-lighted places (in bright field), reddish colors tend to appear vivid, whereas bluish colors tend to appear dull. On the other hand, in low light (in dark field), bluish colors tend to appear vivid, whereas reddish colors tend to appear dull. In short, the human eye is more sensitive to bluish colors, i.e., colors with higher color temperatures, in dark field. This phenomenon of shift in the peak luminance sensitivity of the human eye is generally known as the Purkinje effect.

The light-emitting unit 1 is enabled to cast light of higher color temperatures to the peripheral part of the first irradiation area SA1 and to the third irradiation areas SA3, i.e., to the regions corresponding to the dark field. This arrangement improves the visibility of objects appearing in the peripheral part of the first irradiation area SA1 as well as in the third irradiation areas SA3.

Consequently, in the applications for vehicle headlamps, by setting the light-emitting unit 1 such that the first irradiation area SA1 by the headlamp falls on the center of the road ahead of the headlamp. That is, the peripheral part of the first irradiation area SA1 and the third irradiation area SA3 fall at the sides of the road ahead of the headlamp. This setting improves the visibility of an object moving from the outside to the inside of the first irradiation area SA1 across the third irradiation area SA3. This is effective to prevent a collision of the vehicle with an object running into the road from the side of the road.

<3> Recapitulation

In short, the light-emitting unit 1 according to the present embodiment emits light of a first color temperature and of a second color temperature that is higher than the first color temperature, and light of the second color temperature is cast on the second irradiation areas SA2, which includes the region surrounding the first irradiation area SA1. By the Purkinje effect described above, the light-emitting unit 1 according to the present embodiment improves the visibility of an object appearing in the third irradiation areas SA3, each of which is part of the second irradiation area SA2 and not overlapping the first irradiation area SA1. Accordingly, when the light-emitting unit 1 is used in the applications for vehicle headlamps, each headlamp improves the visibility of an object moving from the outside to the inside of the first irradiation area SA1 across the third irradiation area SA3. Therefore, the risk of the vehicle colliding with the object is reduced.

Embodiment 2

The following describes a vehicle mounted headlamp (hereinafter, simply "headlamp") 1001, which is an example of an illumination system according Embodiment 2, with reference to FIGS. 4 to 10.

Figure 4A:
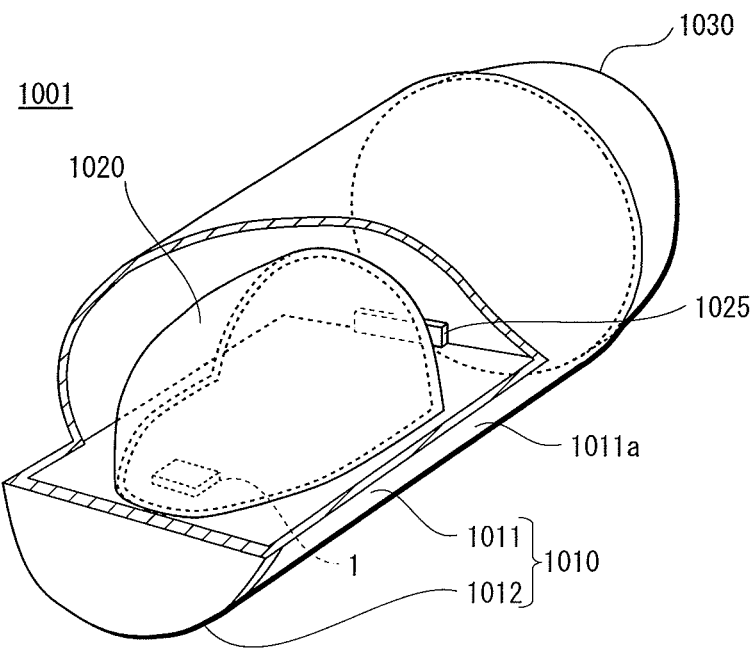
FIG. 4A is a partly-broken oblique view.
Figure 4B:
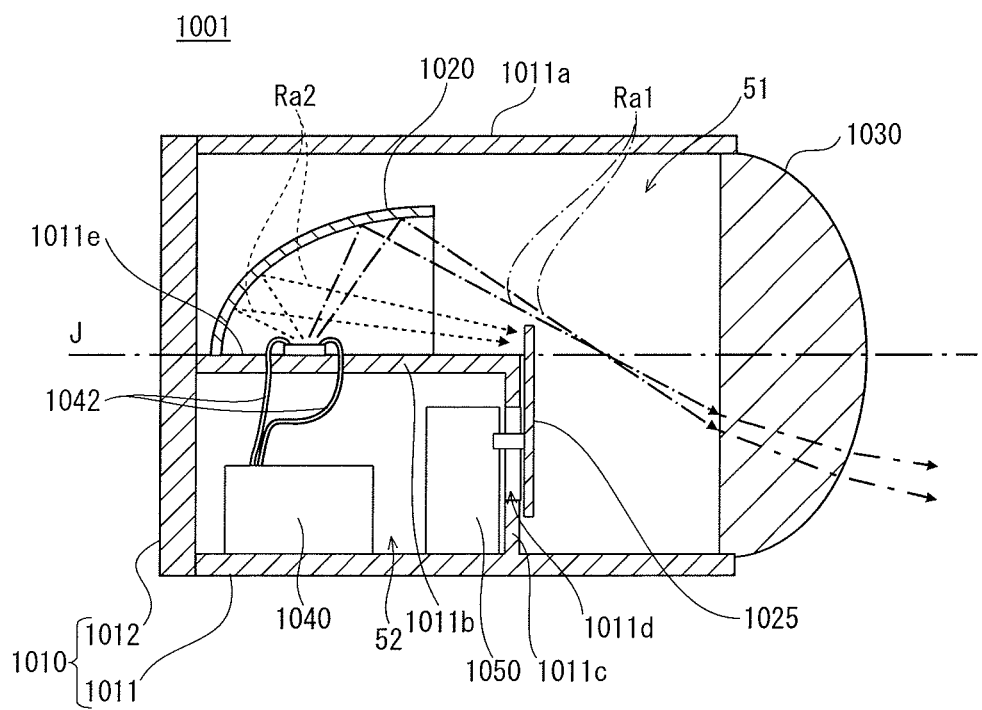
FIG. 4B is a sectional view of a headlamp according to Embodiment 2.

FIG. 4A is a partly-broken oblique view, and FIG. 4B is a sectional view of the headlamp 1001. In FIG. 4B, the straight line J represents the optical axis of the headlamp 1001.

The headlamp 1001 includes a light-emitting unit 1, a housing 1010, a reflector plate 1020, a light-shielding plate 1025, a projecting lens 1030, a power supply unit 1040, and a support 1050 for supporting the light-shielding plate 1025.

The light-emitting unit 1 is identical in structure to the one described in Embodiment 1, and therefore no detailed description is given here.

The housing 1010 includes a body 1011 and a closure plate 1012. The body 1011 has: a cylindrical tubular portion 1011a having a first end and a second end that are axially opposed; a first wall 1011b extending from the first end toward the second end of the cylindrical tubular portion 1011a; and a second wall 1011c extending from the edge of the first wall 1011b closer toward the second end of the cylindrical tubular portion 1011a and in a direction perpendicular to the axial direction. The central axis of the cylindrical tubular portion 1011a coincides with the optical axis J of the headlamp 1001. The first wall 1011b and the second wall 1011c partition the interior space of the cylindrical tubular portion 1011a into the first section S1 and the second section S2. In addition the first wall 1011b is disposed so that a plane 1011e of the wall surface facing the first mounting area S1 contains the optical axis J. In the first section S1, the light-emitting unit 1, the reflector plate 1020, and the light-shielding plate 1025 are located. The light-emitting unit 1 is disposed on the plane 1011e of the first wall 1011b. In the second section S2, the power supply unit 1040 and the support 1050 are located. The second wall 1011c has an opening 1011d through which part of the support 1050 located in the second section S2 extends out to the first section S1. The closure plate 1012 is circular and closes the first end of the cylindrical tubular portion 1011a.

The reflector plate 1020 is a so-called half-shell reflector and reflects light from the light-emitting unit 1 toward a target area that is ahead of the headlamp 1001 along the optical axis J. The reflector plate 1020 is shaped such that its inner surface defines part of a spheroid of revolution and located to bring the two foci of the spheroid onto the optical axis J of the headlamp 1001. That is, the major axis of the spheroid of revolution coincides with the optical axis J. Of the two foci of the spheroid, the one closer to the closure plate 1012 and on the plane 1011e of the first wall 1011b is designated as a first focus, and the other one is designated as a second focus. Then, the light-emitting unit 1 is disposed such that the first focus falls on the first light-emitting portion 20. Due to this arrangement, the light emitted from the light-emitting unit 1 (the first light-emitting portion 20) and is reflected off the inner surface of the reflector plate 1020 travels toward the other one of the two foci of the spheroid of revolution, i.e., to the second focus. In the cross-section taken along the plane containing the optical axis J, the shape defined by the inner surface of the reflector plate 1020 satisfies the relationship given by Equation 1 below.

$$\frac{x^2}{a^2} + \frac{y^2}{b^2} = 1 \qquad \text{[Equation 1]}$$

In Equation 1, (x, y) denote the coordinates describing a point on the inner surface of the reflector plate 1020, "a" denotes the length of the major axis of the spheroid of revolution, and "b" denotes the length of the minor axis of the spheroid of revolution. Then, the distance L01 between the position of the light-emitting unit 1 (the position of the first focus) and the inner surface of the reflector plate 1020 along the direction of the optical axis J can be expressed by Equation 2 below.

$$L01 = a - \sqrt{a^2 - b^2}$$

The light-shielding plate 1025 is made with a black plate. The light-shielding plate 1025 is supported on the support 1050 by being fixed to the part of the support 1050 extending beyond the second section S2 to reach the first section S1. The light-shielding plate 1025 is located between the two foci of the spheroid of revolution along the direction of the optical axis J. That is, the distance L02 between the light-shielding plate 1025 and the inner surface of the reflector plate 1020 along the direction of the optical axis J satisfies the relationship given by Equation 3 below.

$$a-\sqrt{a^2-b^2}<L02<a+\sqrt{a^2-b^2}$$ [Equation 3]

Then, the light-shielding plate 1025 partly projects beyond the edge of the first wall 1011*b* closer to the second end of the cylindrical tubular portion 1011*a* and in the direction opposite to the extending direction of the second wall 1011*c*. This disposition of the light-shielding plate 1025 ensures to block part of light that is emitted from the light-emitting unit 1 and then reflected by the reflector plate 1020 toward the second focus. The support 1050 may be provided with a function of changing the position of the light-shielding plate 1025, whereby how much of the light-shielding plate 1025 projects beyond the edge of the first wall 1011*b* is made adjustable. The advantage of this configuration is that the light distribution characteristics of the headlamp 1001 can be freely changed by adjusting how much of the light-shielding plate 1025 projects beyond the edge of the first wall 1011*b*.

The projecting lens 1030 collects light reflected by the reflector plate 1020. The projecting lens 1030 is a plano-convex lens and attached so as to close the second end of the cylindrical tubular portion 1011*a*. The projecting lens 1030 is disposed (i) outside the area residing between the two imaginary planes each containing one of the two foci of the spheroid of revolution and perpendicular to the direction of the optical axis J and (ii) at a side away from the light-emitting unit 1. That is, the distance L10 between the projecting lens 1030 and the light-emitting unit 1 along the direction of the optical axis J satisfies the relationship given by Equation 4 below.

$$2\times\sqrt{a^2-b^2}<L10$$ [Equation 4]

The projecting lens 1030 and the reflector plate 1020 together constitute a light distribution unit that distributes light emitted from the light-emitting unit 1 to the target area that is ahead of the headlamp 1001 along the direction of the optical axis J.

The power supply unit 1040 is electrically connected to the light-emitting unit 1 via two power lines 1042 and supplies direct-current power (hereinafter DC power) to the light-emitting unit 1.

As shown in FIG. 4B, the headlamp 1001 is configured such that rays of light Ra1 and Ra2, which are part of light emitted from the light-emitting unit 1, are cast to the reflector plate 1020. The ray of light Ra1 is reflected by the reflector plate 1020 to the projecting lens 1030 and then passes through the projecting lens 1030 to exit to the outside. On the other hand, the ray of light Ra2 is also reflected by the reflector plate 1020 but at a relatively smaller angle with respect to the optical axis J contained in the plane 1011*e* of the first wall 1011*b*. Therefore, the ray of light Ra2 is blocked by the light-shielding plate 1025 and thus does not travel toward the projecting lens 1030. As above, out of light reflected by the reflector plate 1020, the light-shielding plate 1025 blocks light reflected at a relatively smaller angle with respect to the optical axis J contained in the plane 1011*e* of the first wall 1011*b*. In this manner, the amount of light emitted in the direction along the optical axis J is controlled.

The following now describes the circuitry of the headlamp 1001.

Figure 5:
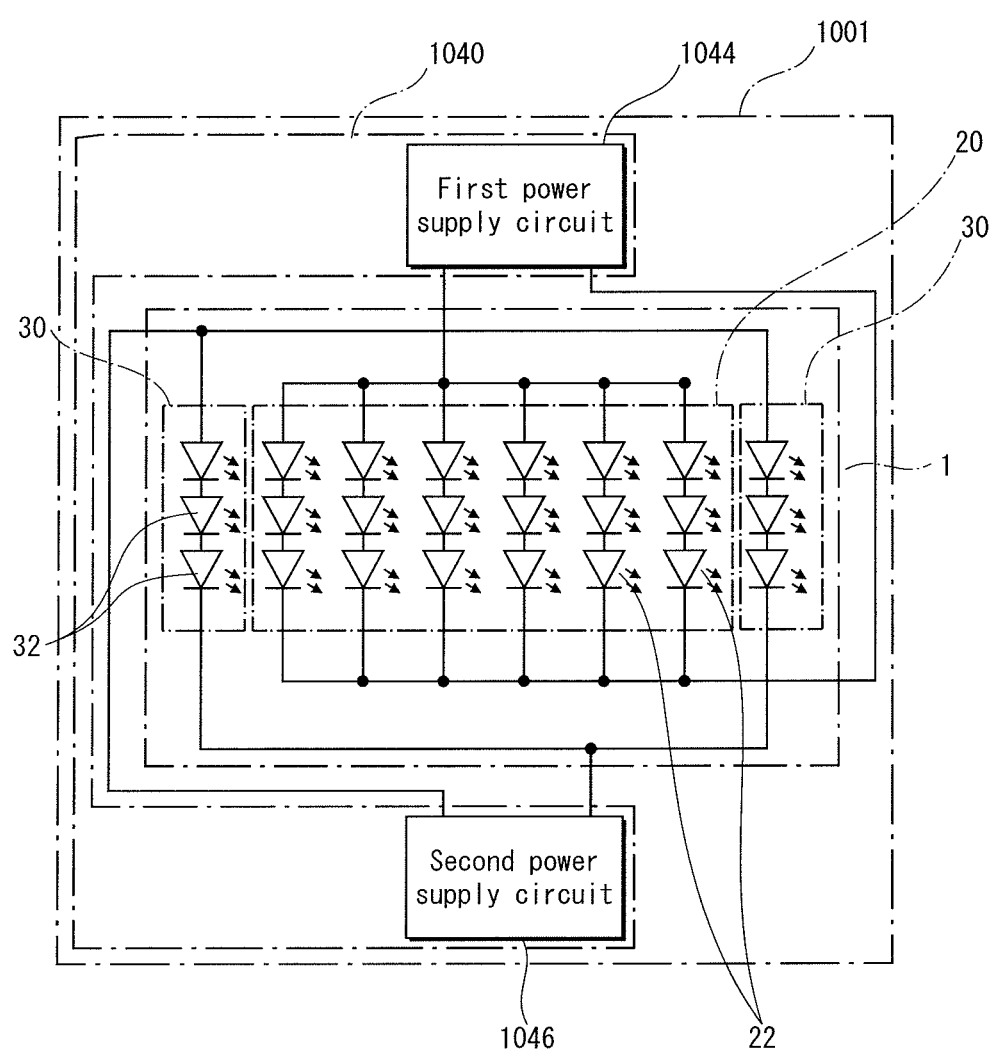
FIG. 5 is a circuit diagram of the headlamp according to Embodiment 2.

FIG. 5 is a circuit diagram of the headlamp 1001.

The light-emitting unit 1 includes separate circuits for the first light-emitting portion 20 and the second light-emitting portions 30. The first light-emitting portion 20 is formed from a circuit in which six series circuits each including three LED chips 22 are connected in parallel, whereas the second light-emitting portions 30 are together formed from a circuit in which two series circuits each including three LED chips 32 are connected in parallel.

The power supply unit 1040 includes a first power supply circuit 1044 for supplying power to the circuits constituting the first light-emitting portion 20 and also includes a second power supply circuit 1046 for supplying power to the circuits constituting the second light-emitting portions 30. The first power supply circuit 1044 and the second power supply circuit 1046 are each a DC voltage converter circuit formed from a plurality of circuits including a step-up chopper circuit that steps up DC voltage supplied from a power supply unit, such as an external battery. As described above, the power supply unit 1040 can control power supply to the circuits of the first light-emitting portion 20 separately from power supply to the circuits of the second light-emitting portions 30. The first power supply circuit 1044 and the second color power supply circuit 1046 may be any other DC voltage converter circuits formed from a step-down circuit, a step-up circuit, and a flyback converter, for example. Hence, the first light-emitting portion 20 can be maintained ON while the second light-emitting portions 30 are maintained OFF. Conversely, the second light-emitting portions 30 can be maintained ON, while the first light-emitting portion 20 is maintained OFF. This achieves the advantage that the light distribution characteristics of the headlamp 1001 can be changed freely.

Suppose, for example, that the first light-emitting portion 20 is set to emit yellowish white light and the second light-emitting portions 30 are set to emit bluish white light. With such settings, by switching the second light-emitting portions 30 ON and OFF, switching between the fog-lamp mode and the normal headlamp mode is performed.

The following describes the light distribution characteristics of the headlamp 1001 according to the present embodiment.

Figure 6:
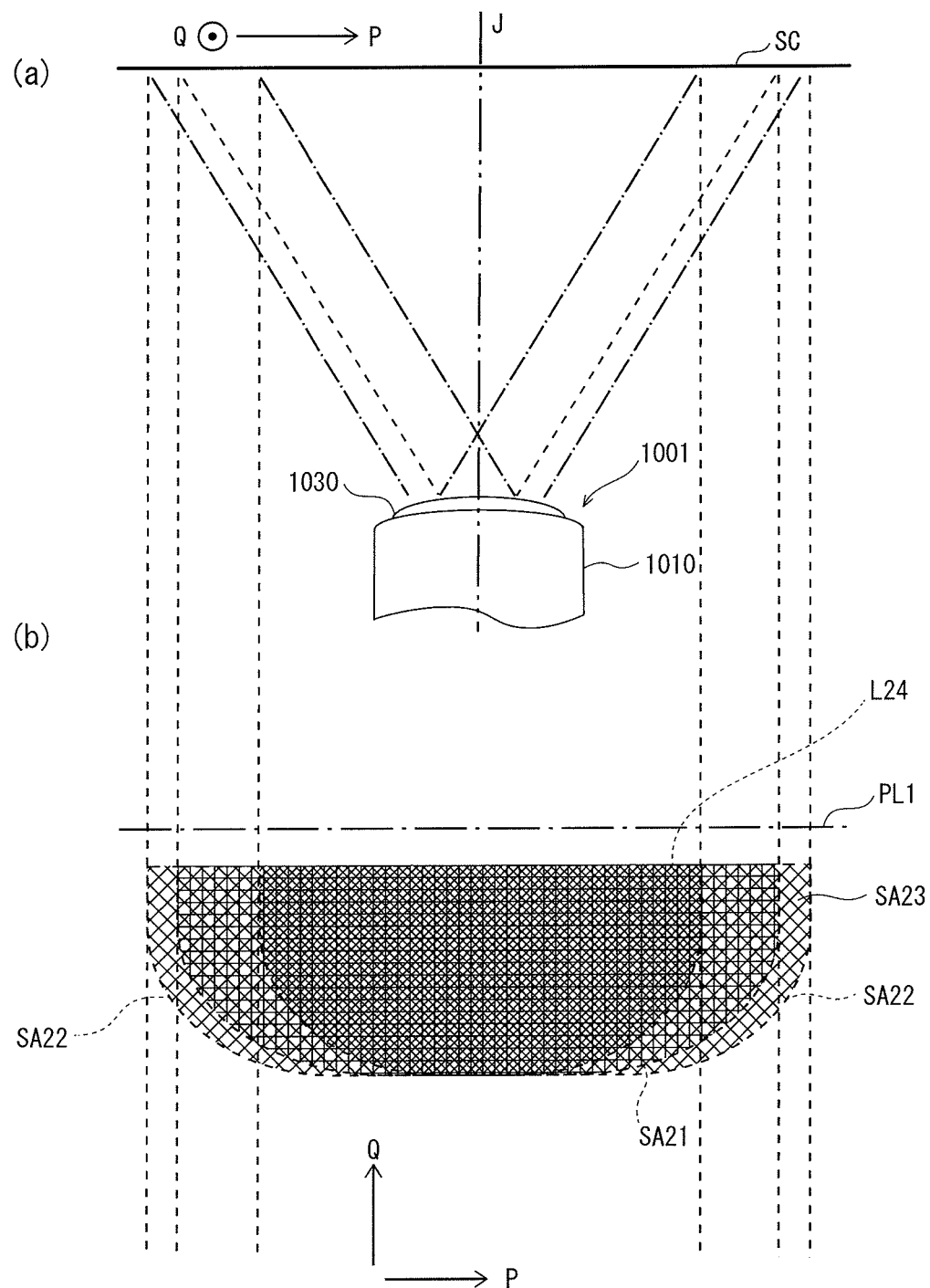
FIG. 6 is a view explaining the light distribution characteristics of the headlamp according to Embodiment 2.

FIG. 6 is a view explaining the light distribution characteristics of the headlamp 1001. In the portion (b) of FIG. 6, the straight line PL1 represents an imaginary plane containing the plane 1011*e* of the first wall 1011*b* of the housing 1010 and also containing the optical axis J. In the portion (a) of FIG. 6, the P-axis direction refers to the direction toward right along the drawing sheet surface, whereas the Q-axis direction refers to the direction perpendicular to the drawing sheet surface and toward the viewer of the figure. In the portion (b) of FIG. 6, the P-axis direction refers to the direction toward right along the drawing sheet surface, whereas the Q-axis direction refers to the upward direction in the figure.

As shown in the portion (a) of FIG. 6, suppose that the screen SC is disposed at a location away from the headlamp 1001 in the direction of the optical axis J of the headlamp 1001 such that the surface of the screen SC is perpendicular to the optical axis J. Then, as the portion (b) of FIG. 6 shows, light emitted from the first light-emitting portion 20 irradiates the first irradiation area SA21 (hatched area with lengthwise and breadthwise lines) of the screen SC, after being reflected by the reflector plate 1020 and passing through the projecting lens 1030. On the other hand, light emitted from each second light-emitting portions 30 is of the second color temperature that is higher than the first color temperature and irradiates the second irradiation area SA22 (hatched area with diagonal lines) of the screen SC, after being reflected by the reflector plate 1020 and passing through the projecting lens 1030. Consequently, of each second irradiation area SA22, the part not overlapping the first irradiation area SA21 (hereinafter, the non-overlapping part is referred to as the "third irradiation area" SA23) exhibits higher color temperature than that of the first irradiation area SA21.

The first irradiation area SA21 is longer in the direction along which the first light-emitting portion 20 and the second light-emitting portions 30 are aligned (i.e., in the P-axis direction) than in the vertical direction (Q-axis direction). This is because the light-emitting 1 is disposed such that the direction along which the first light-emitting portion 20 and the second light-emitting portion 30 are aligned is perpendicular to the optical axis J as well as to the vertical direction. The shape of the first light-emitting portion 20 affects the shape of the first irradiation area SA21. Furthermore, in the case where the first light-emitting portion 20 and the second light-emitting portions 30 are both located at a position coinciding with the first focus of the spheroid of revolution in the direction along the optical axis J, part of light emitted from the first light-emitting portion 20 and the second light-emitting portions 30 is blocked by the light-shielding plate 1025. Therefore, as shown in the portion (b) of FIG. 6, light emitted from the first light-emitting portion 20 and second light-emitting portions 30 (i.e., light emitted from the headlamp 1001) does not irradiate an area above the imaginary plane (cutoff line) PL1.

Within the first irradiation area SA21 and the second irradiation area SA22, the distance from the headlamp 1001 is shortest at the central part of the first irradiation area SA21 and relatively longer at the peripheral part of the first irradiation area SA21 as well as at the third irradiation area SA23. With respect to the brightness within the first irradiation area SA21 and the second irradiation area irradiation areas SA22, the brightness is lower generally in proportion to the square of the distance to the headlamp 1001. Hence, the brightness is lower in the peripheral part of the first irradiation area SA21 and in the third irradiation area SA23 as compared with the brightness in the central part of the first irradiation area SA21.

The headlamp 1001 is enabled to cast light in higher color temperatures to the peripheral part of the first irradiation area SA21 and to the third irradiation area SA23, i.e., to the regions corresponding to the dark field. This arrangement improves the visibility of objects appearing in the peripheral part of the first irradiation area SA21 as well as in the third irradiation area SA23.

The following describes the results of operations simulation of the headlamp 1001.

First, the overview of the operations simulation is descried. The screen SC was set at a location away from the topmost portion of the projecting lens 1030 by the distance L11 along the direction of the optical axis J of the headlamp 1001. In addition, the screen SC was disposed to be perpendicular to the optical axis J. Then, the headlamp 1001 (light-emitting unit 1) was switched ON to irradiate the screen SC, and the color temperature at the point P1 located in the first irradiation area SA1 was calculated. The operations simulation was made on condition that each of the first light-emitting portion 20 and the second light-emitting portions 30 was a point light source, the color temperature of light emitted by the first light-emitting portion 20 was 3000 K, and the color temperature of light emitted by the second light-emitting portions 30 was 8000 K.

Figure 7A:
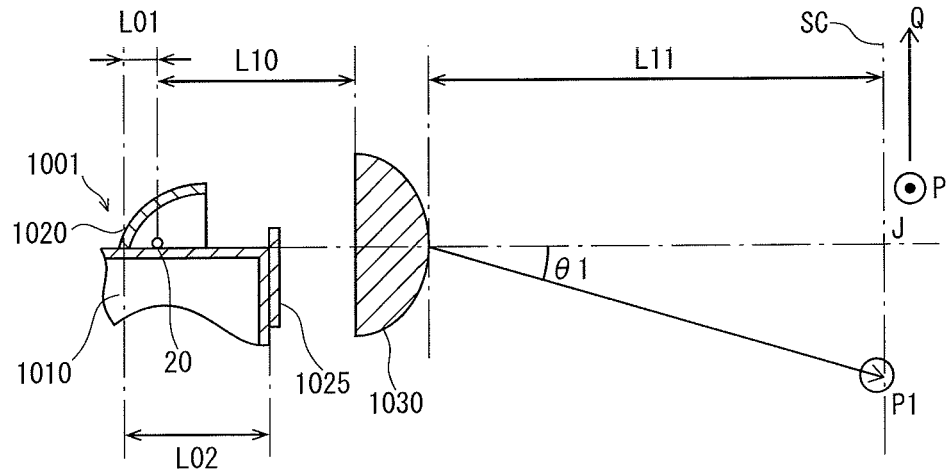
FIGS. 7A and 7B are views for illustrating the details of the operations simulation of the headlamp according to Embodiment 2.
Figure 7B:
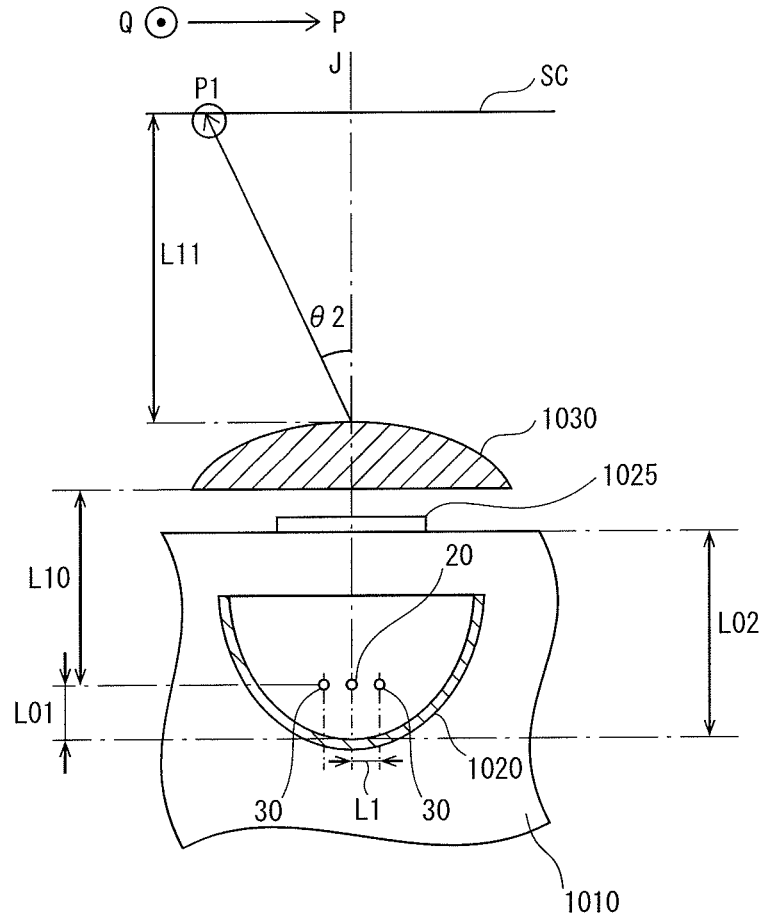

FIGS. 7A and 7B are views for illustrating the details of the operations simulation of the headlamp 1001. In FIG. 7A, the P-axis direction refers to the direction perpendicular to the drawing sheet surface and toward the viewer of the figure, whereas the Q-axis direction refers to the upward direction in the figure. In FIG. 7B, the P-axis direction refers to the direction toward right along the drawing sheet surface, whereas the Q-axis direction refers to the direction perpendicular to the drawing sheet surface and toward the viewer of the figure.

The reflector plate 1020 used in the operations simulation was such that the inner surface of the reflector plate 1020 defined the shape of part of a spheroid of revolution and that the major axis of the spheroid of revolution measured 100 mm and the minor axis measured 80 mm. The focal length of the projecting lens 1030 was 50 mm, and the distance L10 between the first light-emitting portion 20 and the projecting lens 1030 was 50 mm. In addition, the distance L11 from the topmost portion of the projecting lens 1030 to the screen SC along the optical axis J of the headlamp 1001 was 40 m.

The angle $\theta 1$ (see FIG. 7A) formed between (i) the optical axis J within the imaginary plane containing the optical axis J and the Q axis and (ii) the straight line from the topmost portion of the projecting lens 1030 to the point P1 on the screen SC was set to 5°.

Then, on condition that the first light-emitting portion 20 was disposed on the optical axis J and the second light-emitting portions 30 were disposed on the opposite sides of the first light-emitting portion 20 so as to be away from the first light-emitting portion 20 in the P-axis direction, the distribution of color temperatures across the screen SC was calculated.

The color temperature at the point P1 on the screen SC was calculated by the following two methods. In the first method, the color temperature at the point P1 was calculated a plurality of times by varying the angle $\theta 2$ (see FIG. 7B) formed between (i) the optical axis J within the imaginary plane containing the optical axis J and the Q axis and (ii) the straight line from the topmost portion of the projecting lens 1030 to the point P1 on the screen SC, while the distance L1 from the first light-emitting portion 20 to the respective second light-emitting portions 30 was kept constant at 2 mm. In the second method, the color temperature at point P1 was calculated a plurality of times by varying the distance L1 from the first light-emitting portion 20 to the respective the second light-emitting portions 30 within the range of 0 mm to 10 mm, while the angle $\theta 2$ was kept constant at 25°.

In addition, the color temperature at point P1 is expressed by using chromaticity as indexes.

Figure 8:
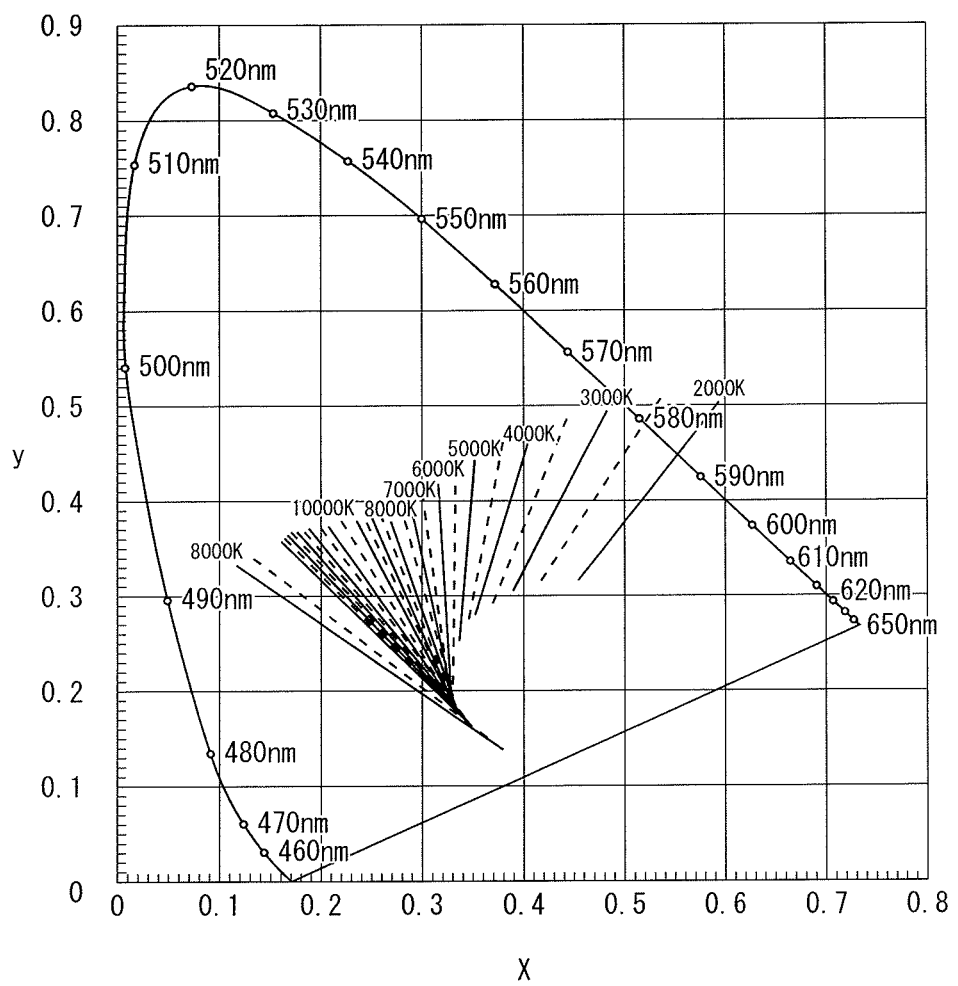
FIG. 8 shows the chromaticity diagram illustrating the operations simulation of the headlamp according to Embodiment 2.

FIG. 8 shows the chromaticity diagram illustrating the operations simulation of the headlamp according to the present embodiment. In FIG. 8, each straight line indicates an isotemperature line.

From FIG. 8, it is apparent that the color temperature tends to be higher for smaller chromaticity coordinates X and Y.

Figure 9A:
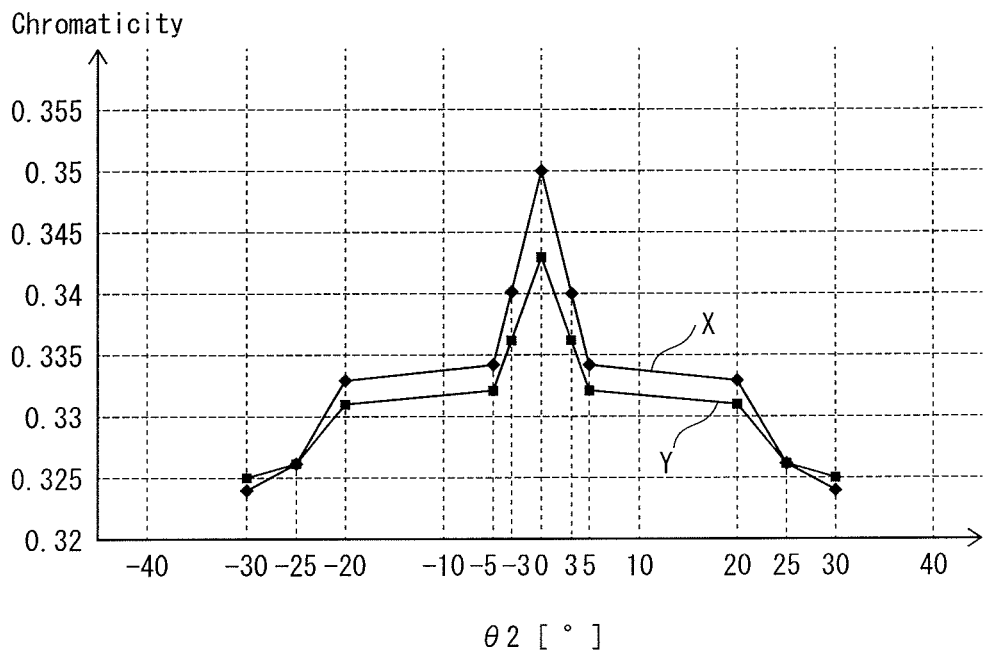
FIGS. 9A and 9B show the results of operations simulation of the headlamp according to Embodiment 2.
Figure 9B:
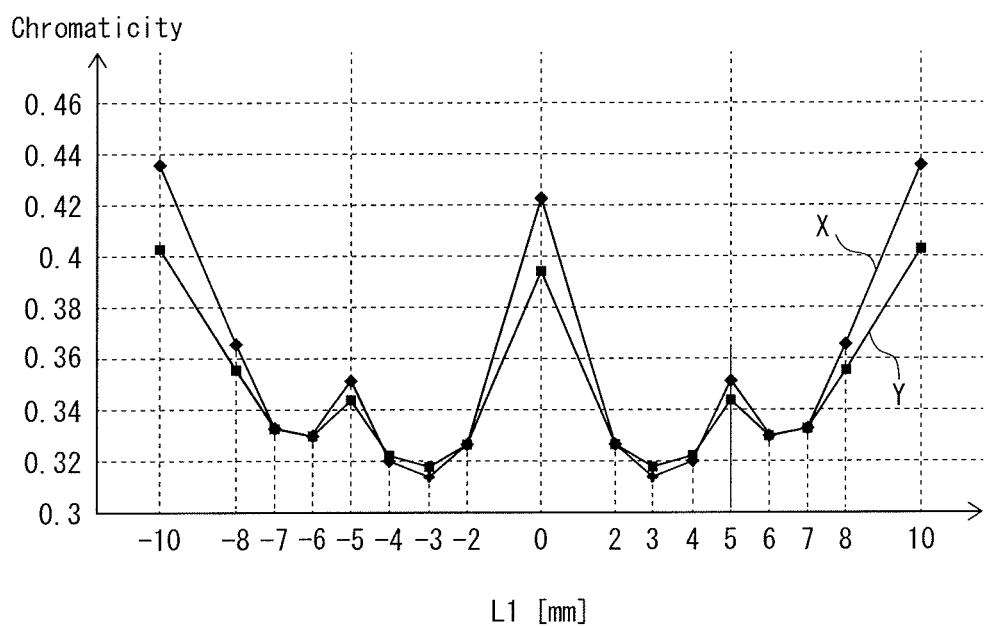

FIG. 9A shows the simulation results obtained by the first method, and FIG. 9B shows the simulation results obtained by the second method.

As shown in FIG. 9A, the chromaticity coordinates X and Y become smaller as the angle $\theta 2$ becomes larger. More specifically, when the angle $\theta 2$ is 0°, the chromaticity coordinates (X, Y) are (0.350, 0.343), and when the angle $\theta 2$ is ±30°, the chromaticity coordinates (X, Y) are (0.324, 0.325). By converting the chromaticity coordinates to a color temperature, it is known that the color temperature falls within a range from 4500 K to 5000 K when the angle $\theta 2$ is 0° and that the color temperature increases to about 6000 K when the angle $\theta 2$ is ±30° (see FIG. 8). As described above, the color temperature of the first irradiation area SA1 is higher in the central part of the first irradiation area SA1 than in the region surrounding the first irradiation area SA1.

In addition, in the case where the angle θ2 is kept constant at 25° as shown in FIG. 9B, the chromaticity coordinates (X, Y) are (0.422, 0.397) when the first light-emitting portion 20 and the second light-emitting portions 30 are disposed without any distance between the respective light-emitting portions. In contrast, when the distance L1 from the first light-emitting portion 20 to the respective second light-emitting portions 30 is changed to fall within the range of 2 mm to 8 mm, the resulting chromaticity coordinates (X, Y) are both within the range of 0.31 to 0.37 or so. By converting the chromaticity coordinates into color temperatures, it is known that the color temperature falls within a range of 3000 K to 3500 K when the distance L1 from the first light-emitting portion 20 to the respective second light-emitting portions 30 is set to zero, and that the color temperature increases to fall within the range of 5000 K to 5500 K when the distance L1 from the first light-emitting portion 20 to the respective the second light-emitting portions 30 is in a range of 2 mm to 8 mm (see FIG. 8).

As is shown by the simulation results, by shifting each second light-emitting portion 30 away from the first light-emitting portion 20 in the direction perpendicular to the optical axis J by the distance in a range of 2 mm to 8 mm, the color temperature increases in the region surrounding the first irradiation area SA1 that is irradiated by the first light-emitting portion 20.

By guiding part of light emitted from the headlamp 1001 toward a position upward of the road (upward along the Q-axis direction shown in the portion (b) of FIG. 6), the visibility of, for example, a road sign positioned high above the road improves. From the standpoint of visibility, it is desirable for the light traveling toward a position upward of the road to have higher color temperatures.

Yet, as long as the positions of the first light-emitting portion 20 and of the second light-emitting portions 30 all coincide with the first focus of the spheroid of revolution in the direction of the optical axis J, none of light emitted from the first light-emitting portion 20 and the second light-emitting portions 30 irradiates a region above the imaginary plane (cutoff line) PL1 (see the portion (b) of FIG. 6). Therefore, the following discuss the method for allowing light that is emitted from the second light-emitting portions 30 and then reflected by the reflector plate 1020 to travel toward a position upward of the road, by shifting the positions of the second light-emitting portion 30.

Figure 10A:
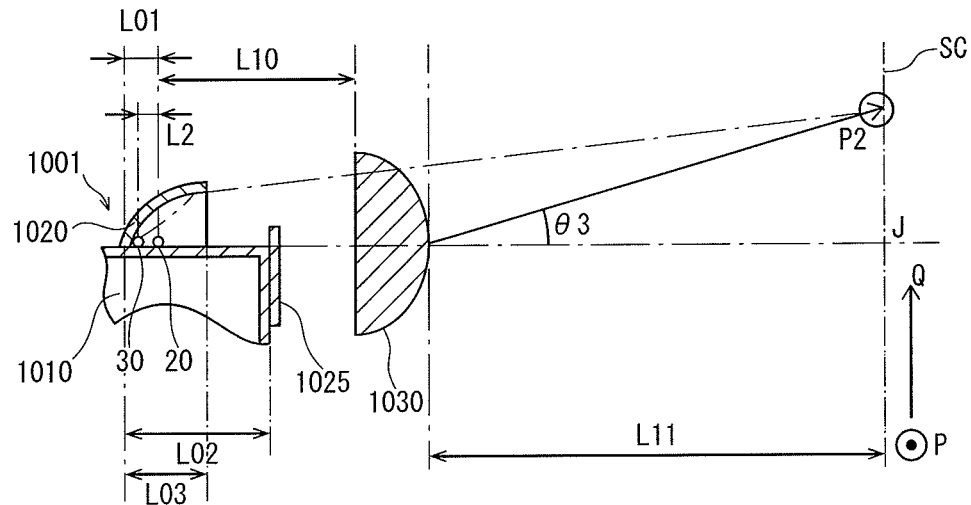
FIGS. 10A and 10B are views for illustrating the details of the operations simulation of the headlamp according to Embodiment 2.
Figure 10B:
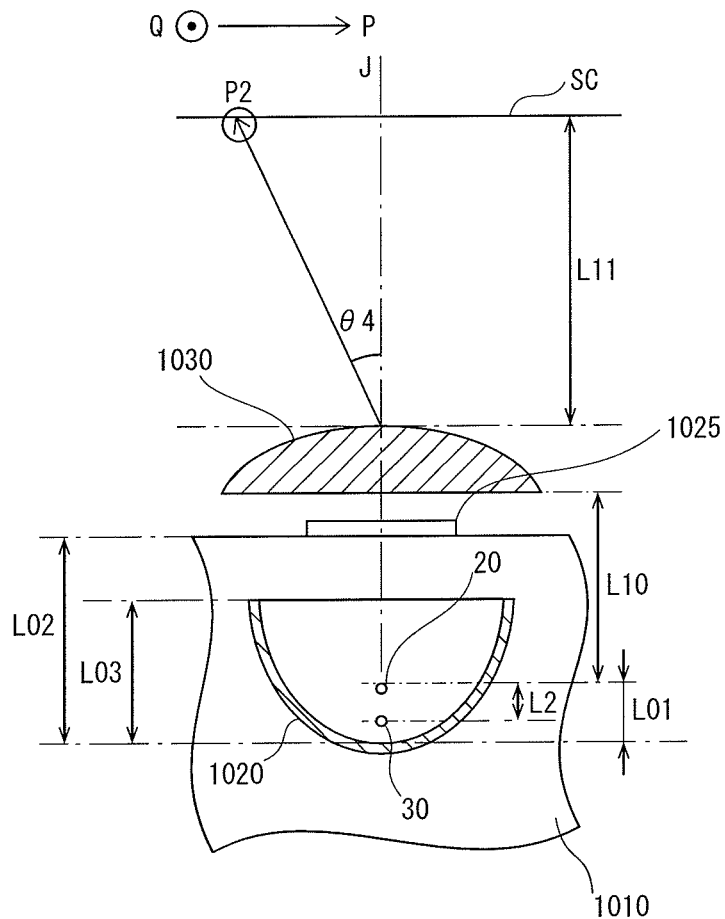

FIGS. 10A and 10B are views for illustrating the details of the operations simulation of the headlamp 1001. In FIG. 10A, the P-axis direction refers to the direction perpendicular to the drawing sheet surface and toward the viewer of the figure, whereas the Q-axis direction refers to the upward direction in the figure. In FIG. 10B, the P-axis direction refers to the direction toward right along the drawing sheet surface, whereas the Q-axis direction refers to the direction perpendicular to the drawing sheet surface and toward the viewer of the figure.

This operations simulation was run using the same settings as the operations simulation described with reference to FIG. 7, the setting including the shape defined by the inner surface of the reflector plate 1020, the focal length of the projecting lens 1030, the distance L10 from the first light-emitting portion 20 to the projecting lens 1030, and the distance L11 from the topmost portion of the projecting lens 1030 to the screen SC.

In addition, the angle θ3 (see FIG. 10A) formed between (i) the optical axis J within the imaginary plane containing the optical axis J and the Q axis and (ii) the straight line from the topmost portion of the projecting lens 1030 to the point P2 on the screen SC was set to 5°.

In order for the light emitted from the second light-emitting portion 30 and then reflected by the reflector plate 1020 to travel upwardly (i.e., the upward direction along the Q-axis direction shown in FIG. 6B), each second light-emitting portion 30 needs to be located at least partly between the first light-emitting portion 20 and the inner surface of the reflector plate 1020. In addition, for the light emitted from each second light-emitting portion 30 and then reflected once by the reflector plate 1020 to exit to the outside, the length L03 of the inner shape of the reflector plate 1020 measured along the major axis needs to be shorter than half the length of the major axis of the spheroid of revolution. Therefore, the operations simulation was run on precondition that the length L03 of the reflector plate 1020 along the optical axis J was shorter than half the length of the major axis of the spheroid of revolution. The second light-emitting portion 30 was disposed between the first light-emitting portion 20 and the inner surface of the reflector plate 1020 along the direction of the optical axis J. Then, the color temperature at the point P2 on the screen SC was calculated (see FIGS. 10A and 10B).

Note that the color temperature of the point P2 on the screen SC was measured a plurality of times by varying the distance L2 between the first light-emitting portion 20 and the second light-emitting portion 30 within the range of 0 mm to −10 mm, while keeping the angle θ4 constant at 25°. Note that the distance L2 takes a positive value when the distance L is measured in the direction closer toward the projecting lens 1030 along the optical axis J.

Figure 11:
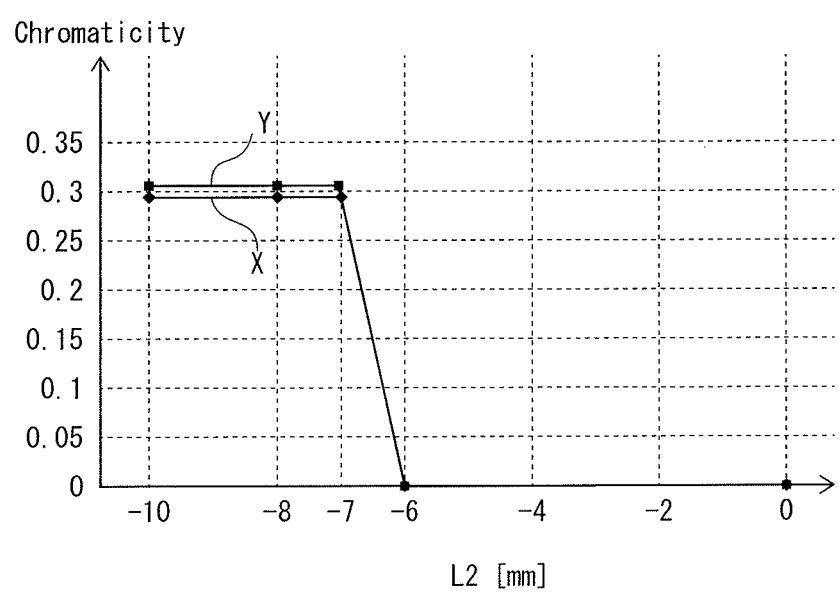
FIG. 11 shows the results of operations simulation of the headlamp according to Embodiment 2.

FIG. 11 shows the results of the operations simulation run by the method described with reference to FIGS. 10A and 10B.

As shown in FIG. 11, light emitted from the second light-emitting portion 30 does not reach the point P2 when the distance L2 between the first light-emitting portion 20 and the second light-emitting portion 30 is within the range of 0 mm to −7 mm. On the other hand, when the distance L2 is within the range of −7 mm to −10 mm, part of light emitted from the second light-emitting portion 30 reaches the point P2.

When the distance L2 is within the range of 0 mm to −7 mm, the incident angle at which light emitted from the second light-emitting portion 30 hits the reflector plate 1020 is relatively large. Therefore, the entire light emitted from the second light-emitting portion 30 and reflected by the reflector plate 1020 travel along the optical axis J. That is, none of the light travels toward the point P2. On the other hand, when the distance L2 is within the range of −7 mm to −10 mm, the angle at which light emitted from the second light-emitting portion 30 hits the reflector plate 1020 is relatively small. Therefore, part of light emitted from the second light-emitting portion 30 and reflected by the reflector plate 1020 travels in the direction away from optical axis J and some of such light reaches the point P2 (indicated by the dashed line in FIG. 10A).

The chromaticity coordinates (X, Y) describing the chromaticity of light arriving at the point P2 are approximately (0.295, 0.305). By converting the chromaticity into the color temperature, it is known that the color temperature falls in the range of 7500 K to 8000 K. That is, by shifting the second light-emitting portion 30 away from projecting lens 1030 along the optical axis J, it is ensured that light of a relatively high color temperature (in the range of 7500 K to 8000 K) irradiates the area above the first irradiation area SA1 along the Q-axis direction of the first irradiation area SA1 (hereinafter, this irradiation area above the first irradiation area SA1 is referred to as the "fourth irradiation area").

In the manner described above, the second light-emitting portion 30 is disposed away from the first light-emitting portion 20, i.e., away from the first focus on the inner surface of the reflector plate 1020 having the shape of a spheroid of revolution, and in the direction closer toward the reflector plate 1020. By this arrangement, it is ensured that part of light emitted from the second light-emitting portion 30 at a relatively high color temperature irradiates the fourth irradiation area that is located above the first irradiation area SA1.

With the headlamp having this configuration, when the first irradiation area SA1 is set to come to the center of the road ahead of the headlamp, the fourth irradiation area falls at the position forwardly above the road. As a consequence, the visibility of an object located forwardly above the first irradiation area SA1 improves. That is, for example, a road sign disposed at a location above the road ahead of the headlamp is irradiated with light of a relatively high color temperature. Thus, the visibility of the road sign under dark field as is typical during nighttime hours, for example, improves.

<Modifications>

(1) Embodiment 1 described above is directed to the light-emitting device 1 in which the first wavelength converter 24 contains phosphor different from that contained in the second wavelength converters 34. By this arrangement, the first light-emitting portion 20 emits light of the first color temperature and the second light-emitting portions 30 emit light of the second color temperature. However, this is merely an example and the first wavelength converter 24 and the second wavelength converters 34 are not limited to such structure.

For example, the second wavelength converter 34 may be modified to have lower wavelength conversion efficiency than that of the first wavelength converter 24. By this modification, the first light-emitting portion 20 emits light of the first color temperature and the second light-emitting portions 30 emit light of the second color temperature.

More specifically, according to this modification, the first wavelength converter 24 and the second wavelength converters 24 all contain the same type of yellow phosphor. Yet, the content of the yellow phosphor is 30% by weight in the first wavelength converter 24 and 10% by weight in the respective second wavelength converters 34. Hence, the wavelength conversion efficiency of the first wavelength converter 24 is greater than the wavelength conversion efficiency of the respective second wavelength converters 34. Therefore, the color of light emitted by the first light-emitting portion 20 is yellowish white, whereas the color of light emitted by the respective second light-emitting portions 30 is bluish white.

(2) Embodiment 1 described above is directed to the light-emitting device 1 in which each second light-emitting portion 30 has the second wavelength converter 34. Alternatively, however, each second light-emitting portion 30 may have a transparent optical component (not illustrated) instead of the second wavelength converter 34. In this modification, blue light emitted from the LED chips 32 exits to the outside without undergoing any wavelength conversion.

(3) Embodiment 1 described above is directed to the light-emitting device 1 in which the mounting substrate 10 is adhered to the heat transfer plate 40 via the adhesive sheet 19. However, this is merely one example and without limitation. For example, the mounting substrate 10 may be bonded to the heat transfer plate 40 by a bonding material containing Cu or Al.

(4) Embodiment 1 described above is directed to the light-emitting device 1 in which the first light-emitting portion 20 is disposed in the first mounting area AR1 and the second light-emitting portions 30 are disposed on the second mounting areas AR2 that are located at the sides of the first mounting area AR1. The sides of the first mounting area AR1 are opposed to each other so as to have the central part of the first mounting area AR1 inbetween. However, the arrangement of the first light-emitting portion 20 and the second light-emitting portions 30 is not limited to such.

Figure 12A:
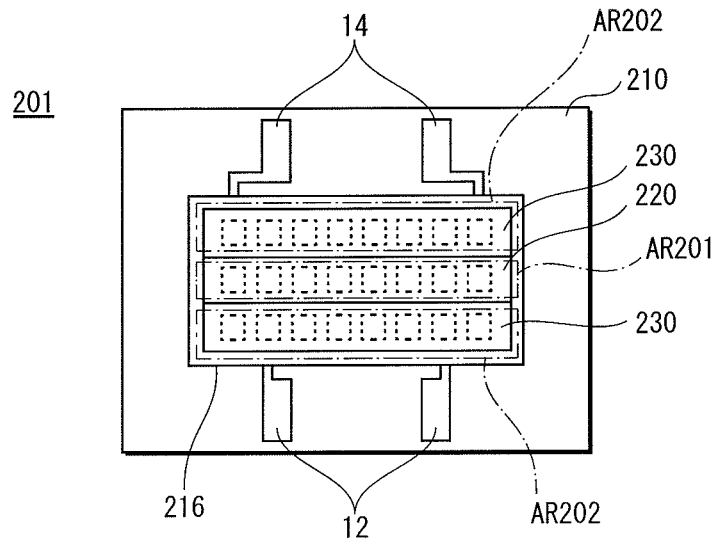
FIGS. 12A and 12B are plan views showing important parts of light-emitting devices according to two different modifications.
Figure 12B:
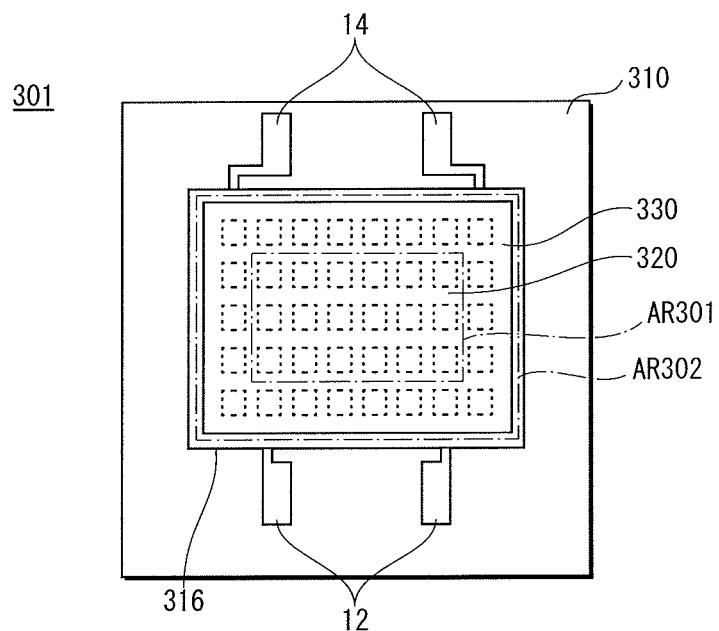
Figure 13A:
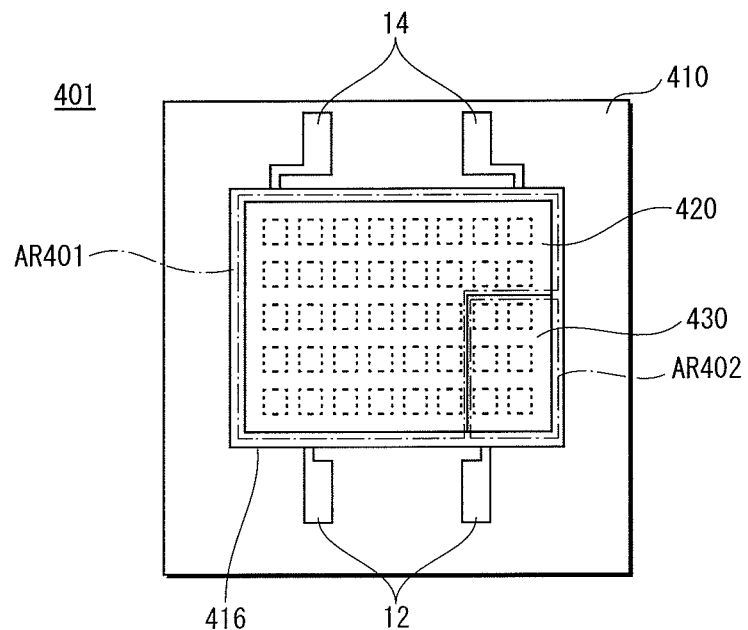
FIGS. 13A and 13B are plan views showing important parts of light-emitting devices according to another two different modifications.
Figure 13B:
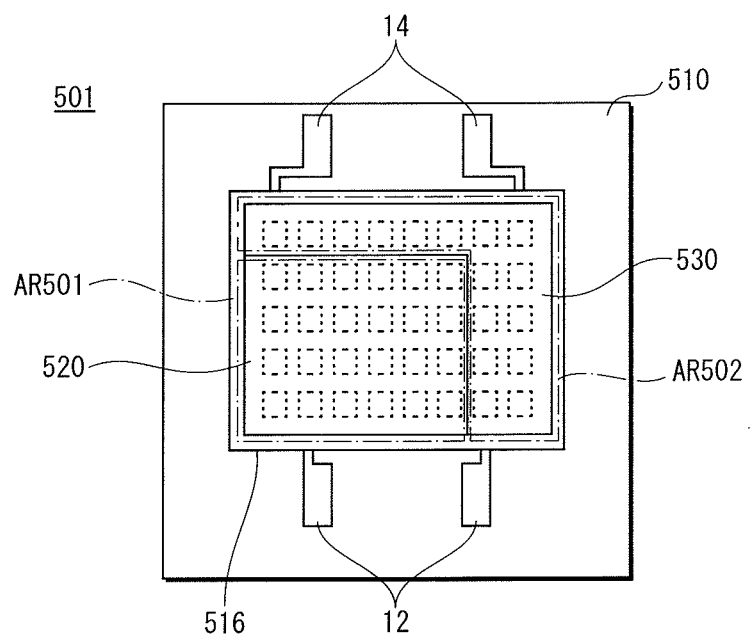

FIGS. 12A and 12B as well as FIGS. 13A and 13B are plan views each showing important parts of one of light-emitting devices 201-501 according to modifications.

As shown in FIG. 12A, the light-emitting device 201 has a first light-emitting portion 220 disposed in a first mounting area AR201 on the mounting substrate 210, the first mounting area AR201 having the shape of an elongated strip. In addition, the light-emitting device 201 has two second light-emitting portions 230 in second mounting areas AR202 also having the shape of an elongated strip and adjacent to the first mounting area AR201 in the shorter-side direction of the first mounting area AR201. In this modification, the first light-emitting portion 220 emits light of the first color temperature to irradiate a first irradiation area SA1. The second light-emitting portions 230 emit light of the second color temperature that is higher than the first color temperature to irradiate irradiation areas that are in flanking relation at opposite sides of the first irradiation area SA1, the sides opposing in the vertical direction.

According to this modification, the irradiation areas flanking the first irradiation area SA1 in the vertical direction are irradiated with light of the second color temperature, which is higher than the first color temperature. This improves the visibility of an object appearing in the irradiation areas flanking the sides of the first irradiation area SA1 in the vertical direction.

Next, as shown in FIG. 12B, the light-emitting device 301 has a second light-emitting portion 330 mounted in a second mounting area AR302 of the mounting substrate 310, and the second mounting area AR302 has an annular shape so as to completely surround the first mounting area 302 in the region surrounding the first mounting area. The first light-emitting portion 320 is disposed in the first mounting area AR302. In this modification, the first light-emitting portion 320 emits light of the first color temperature to irradiate a first irradiation area SA1. The second light-emitting portions 330 emit light of the second color temperature that is higher than the first color temperature to irradiate the entire region surrounding the first irradiation area SA1.

According to this modification, the entire region surrounding the first irradiation area SA1 is irradiated with light of the second color temperature, which is higher than the first color temperature. This improves the visibility of an object appearing in the region surrounding the first irradiation area SA1 regardless of where the object is located in the surrounding region being a dark field.

Next, as shown in FIG. 13A, the light-emitting device 401 has a second light-emitting portion 430 mounted in a second mounting area AR402 of the mounting substrate 410. The second mounting area AR402 is a rectangle area located at the lower right corner of the mounting substrate 410. The light-emitting device 401 also has a first light-emitting portion 420 in a first mounting area AR401 which is the entire region of the mounting substrate 410 other than the second mounting area AR402 and has the shape complementary to the second mounting area AR402.

Suppose that a light-emitting unit (not illustrated) has the light-emitting device 401 and a screen is disposed at a location away from the light-emitting unit along the direction of the optical axis (i.e., the light emission direction and thus perpendicular to the mounting substrate 410). The screen is disposed to be perpendicular to the optical axis (see the portion (a) of FIG. 3). In this arrangement, the plane on which the first light-emitting portion 420 and the second light-emitting portion 430 of the light-emitting device 401 are disposed in substantially parallel face-to-face relation with the screen. In the portion (a) of FIG. 3, the second light-emitting portion 430 is disposed at the left of the optical axis, i.e., in the negative direction along the P axis. Then, on the screen, the first light-emitting portion 420 irradiates a first irradiation area SA1, and the second light-emitting portion 430 irradiates an area in the vicinity of the lower left corner of the first irradiation area SA1. That is, on the same coordinate system as that in the portion (b) of FIG. 3, the irradiation area of the second light-emitting portion 430 corresponds to a region at a location beyond the optical axis in the negative direction along the P axis and also in the negative direction along the Q axis.

Suppose that the light-emitting unit 1 constituting part of the headlamp 1001 shown in FIG. 4 is replaced by the light-emitting unit included in the light-emitting device 401 according to this modification. The optical axis J of the headlamp 1001 is parallel to the main surface of the mounting substrate 410 and coincides with the direction in which each conductor pattern 12 extends. Also, the second light-emitting portion 430 as well as the respective conductor patterns 12 is located at a side closer to the closure plate 1012 along the direction of the optical axis.

Then, suppose that the screen is disposed perpendicular to the optical axis at a location away from the headlamp 1001 along the direction of the optical axis of the headlamp 1001 (see the portion (a) of FIG. 6). Then, on the screen, the first light-emitting portion 420 irradiates a first irradiation area SA1, and the second light-emitting portion 430 irradiates an area in the vicinity of the upper right corner of the first irradiation area SA1. That is, on the same coordinate system as that in the portion (b) of FIG. 6, the irradiation area of the second light-emitting portion 430 corresponds to a region at a location beyond the optical axis in the positive direction along the P axis and also in the positive direction along the Q axis.

Next, as shown in FIG. 13B, the light-emitting device 501 has a first light-emitting portion 520 mounted in a first mounting area AR501 of the mounting substrate 510. The first mounting area AR501 is a rectangle area at the lower left corner of the surface of the mounting substrate 510. The light-emitting device 501 also has a second light-emitting portion 530 in a second mounting area AR502 that is an L-shaped continuous area including an upper part and a right part of the surface of the mounting substrate 510.

Suppose that a light-emitting unit (not illustrated) has the light-emitting device 501 and a screen is disposed perpendicular to the optical axis at a location away from the light-emitting unit along the direction of the optical axis (i.e., the light emission direction and thus the direction perpendicular to the mounting substrate 510) (see the portion (a) of FIG. 3). In this arrangement, the plane on which the first light-emitting portion 520 and the second light-emitting portion 530 of the light-emitting device 501 are disposed in substantially parallel face-to-face relation with the screen. In addition, in the portion (a) of FIG. 3, suppose that the second light-emitting portion 530 is disposed at a location adjoining the left edge and the upper edge of the first light-emitting portion 520. That is, the second light-emitting portion 530 is adjacent to the first light-emitting portion 520 from the negative direction along the P axis and the position direction along the Q axis. Then, on the screen, the first light-emitting portion 520 irradiates a first irradiation area SA1, and the second light-emitting portion 530 irradiates an area at the left of the first irradiation area SA1 and also irradiates an area above the first irradiation area SA1. That is, on the same coordinate system as that in the portion (b) of FIG. 3, the irradiation area of the second light-emitting portion 530 corresponds to a region at a location beyond the optical axis in the negative direction along the P axis and also in the positive direction along the Q axis.

Suppose that the light-emitting unit 1 constituting part of the headlamp 1001 shown in FIG. 4 is replaced by the light-emitting unit included in the light-emitting device 501 shown in FIG. 13B. The optical axis J of the headlamp 1001 coincides with the direction in which each conductor pattern 12 extends. In addition, the first light-emitting portion 520 as well as the respective conductor patterns 12 is located at a side closer to the closure plate 1012.

Then, suppose that the screen is disposed perpendicular to the optical axis at a location away from the headlamp 1001 along the direction of the optical axis of the headlamp 1001 (see the portion (a) of FIG. 6). Then, on the screen, the first light-emitting portion 520 irradiates a first irradiation area SA1, and the second light-emitting portion 530 irradiates an area at the right of the first irradiation area SA1 and also irradiates an area below the first irradiation area SA1. That is, on the same coordinate system as that in the portion (b) of FIG. 6, the irradiation area of the second light-emitting portion 530 corresponds to a region at a location beyond the optical axis in the positive direction along the P axis and also in the negative direction along the Q axis.

(5) Embodiment 1 described above is directed to the light-emitting device 1 in which the first wavelength converter 24 and the second wavelength converters 34 all have the same thickness but contain different phosphors. However, this is merely an example and the first wavelength converter 24 and the second wavelength converters 34 not necessarily have the same thickness.

Figure 14A:
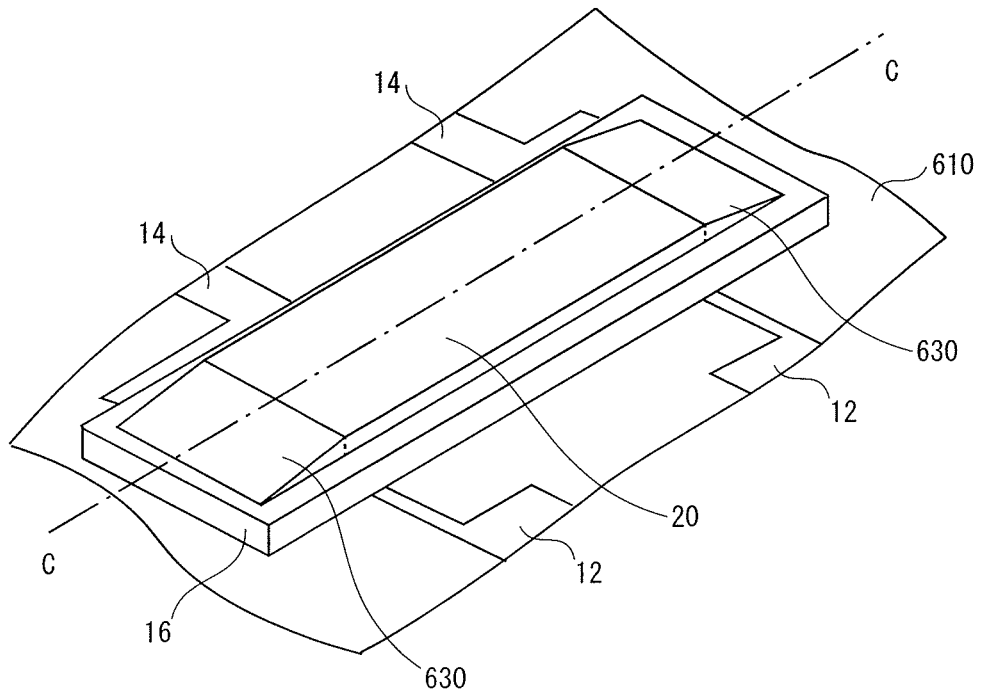
FIG. 14A is an oblique view showing important parts of a light-emitting device according to a yet another modification.
Figure 14B:
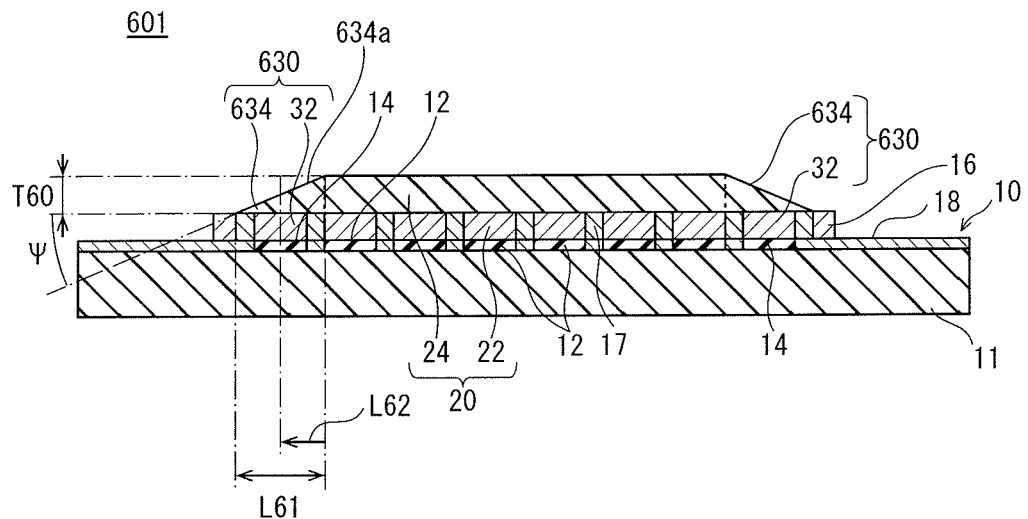
FIG. 14B is a sectional view taken along the line C-C of FIG. 14A.

FIG. 14A is an oblique view and FIG. 14B is a sectional view showing important parts of a light-emitting device 601 according to one modification. Note that components similar to those described in Embodiment 1 are denoted by the same reference signs and descriptions thereof are omitted appropriately.

The light-emitting device 601 has two second light-emitting portion 630 each including LED chips 32 disposed in a second mounting area AR2 (see FIG. 2) and a second wavelength converter 634 disposed to encapsulate the LED chips 32. The second wavelength converter 634 converts part of light in the first wavelength range to light in the second wavelength range. A portion of the second wavelength converter 634 is thinner than the first wavelength converter 24 in the main emission direction of light from the LED chips 32. The main emission direction is perpendicular to the mounting surface of the LED chips 32 on the mounting substrate 10. More specifically, for example, the thickness of the second wavelength converter 634 in the main emission direction is gradually decreased toward a location away from the first wavelength converter 24. That is, a surface 634a of the second wavelength converter 634 facing away from the LED chips 32 is tapered in a manner that the height of the second wavelength converter 634 gradually decreases toward a location away from the first wavelength converter 24.

Here, let L61 denote the length of each second light-emitting portion 630 measured in the direction in which the first light-emitting portion 20 and the second light-emitting portions 630 are aligned, T60 denote the thickness of the first wavelength converter, and $\phi$ denote the inclination angle between (i) the tapered surface 634a of the second wavelength converter 634 and (ii) the mounting surface (i.e., the surface of the mounting substrate 10) on which the LED chips 32 are disposed. Then, the thickness T63 of the second wavelength converter 634 measured in the main emission direction and at a location away from the boundary between the first light-emitting portion 20 and the second light-emitting portion 630 satisfies the relationship given by Equations 5 and 6 below.

$$T63 = T60 - L62 \times \tan\phi \qquad \text{[Equation 5]}$$

$$0 < \phi < \arctan\left(\frac{T60}{L62}\right) \qquad \text{[Equation 6]}$$

Note that the wavelength conversion efficiency of the second wavelength converter wavelength converter depends on the thickness of the second wavelength converter 634. That is, as the thickness is decreased, the wavelength conversion efficiency is lowered and thus light emitted by the second light-emitting portion 630 becomes bluish white light.

As is apparent from Equations 5 and 6, by setting the inclination angle φ of the tapered surface to an appropriate angle, the thickness of the second wavelength converter 634 is made to vary in a desired thickness distribution. Hence, the wavelength conversion efficiency of the second wavelength converter 634 is made to vary in a desired distribution so that white light of a desired color temperature is emitted.

Figure 15A:
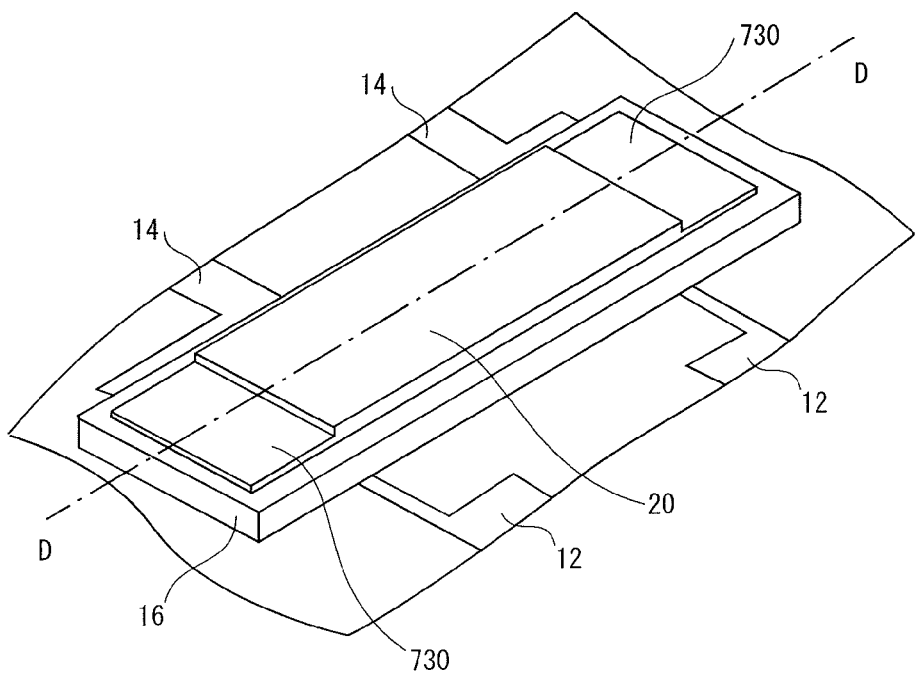
FIG. 15A is an oblique view showing important parts of a light-emitting device according to a yet another modification.
Figure 15B:
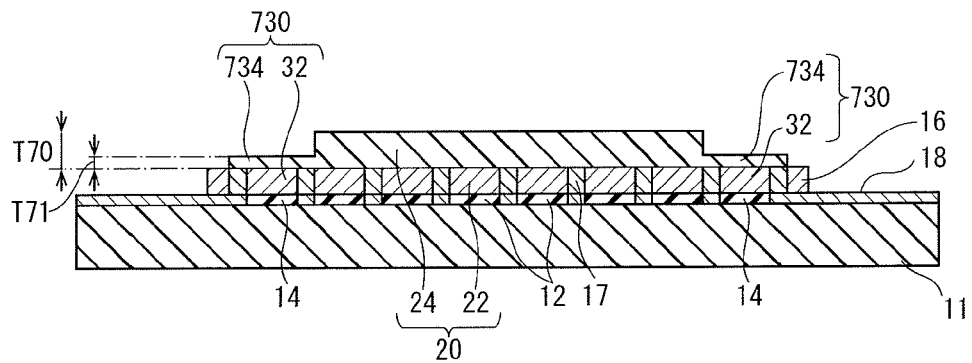
FIG. 15B is a sectional view taken along the line D-D of FIG. 15A.

FIG. 15A is an oblique view and FIG. 15B is a sectional view showing important parts of a light-emitting device 701 according to another modification. Note that components similar to those described in Embodiment 1 are denoted by the same reference signs and descriptions thereof are omitted appropriately.

In the light-emitting device 701, the thickness T71 of a first wavelength converter 24 is smaller than the thickness T72 of each second wavelength converter 734.

Figure 16A:
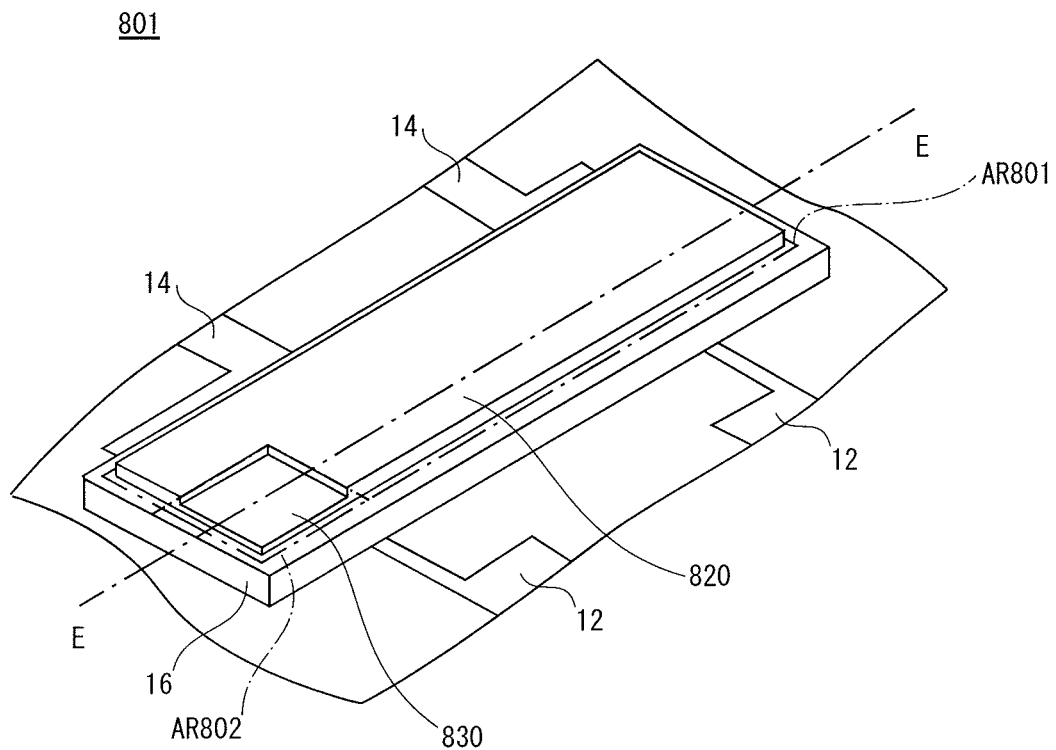
FIG. 16A is an oblique view showing important parts of a light-emitting device according to a yet another modification.
Figure 16B:
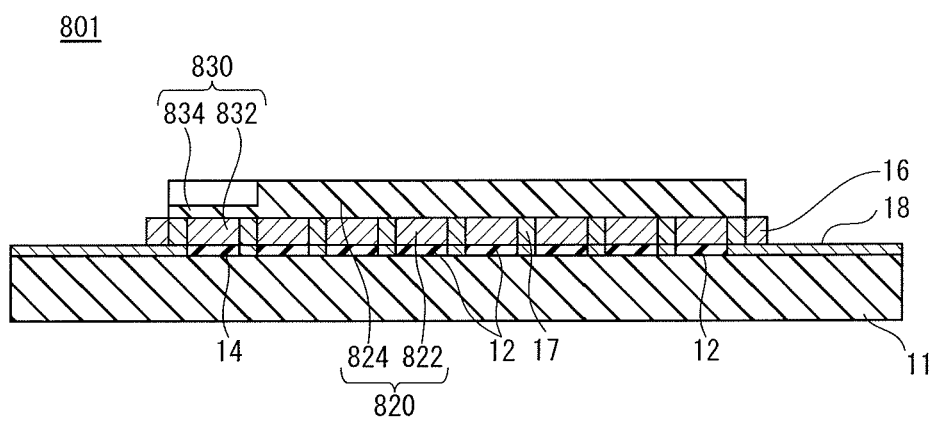
FIG. 16B is a sectional view taken along the line E-E of FIG. 16A.

FIG. 16A is an oblique view and FIG. 16B is a sectional view showing important parts of a light-emitting device 801 according to a yet another modification. Note that components similar to those described in Embodiment 1 are denoted by the same reference signs and descriptions thereof are omitted appropriately.

The light-emitting device 801 has a second light-emitting portion 830 mounted in a second mounting area AR802 of the mounting substrate 810. The second mounting area AR802 is a rectangle area located at the lower right corner of the mounting substrate 810. The light-emitting device 801 also has a first light-emitting portion 820 in a first mounting area AR801 which is the entire region of the mounting substrate 810 other than the second mounting area AR402 and has the shape complementary to the second mounting area AR802. The thickness T81 of a first wavelength converter 824 of the first light-emitting portion 820 is smaller than the thickness T82 of the second wavelength converter 834 of the second light-emitting portion 830.

(6) Embodiment 1 described above is directed to the light-emitting device 1 in which the LED chips 22 of the first light-emitting portion 20 and the LED chips 32 of the second light-emitting portions 30 all emit light in the first wavelength range. Then, the respective light-emitting portions are made to emit light of mutually different color temperatures, by employing the first wavelength converter 24 converting light in the first wavelength range to light of the second wavelength range and the second wavelength converter 34 converting light in the first wavelength range to light of the third wavelength range. Alternatively, light of mutually different color temperatures can be obtained by a modification such that the LED chips 22 included in the first light-emitting portion 20 and the LED chips 32 included in the second light-emitting portion 30 to emit light of mutually different wavelength ranges.

Figure 17A:
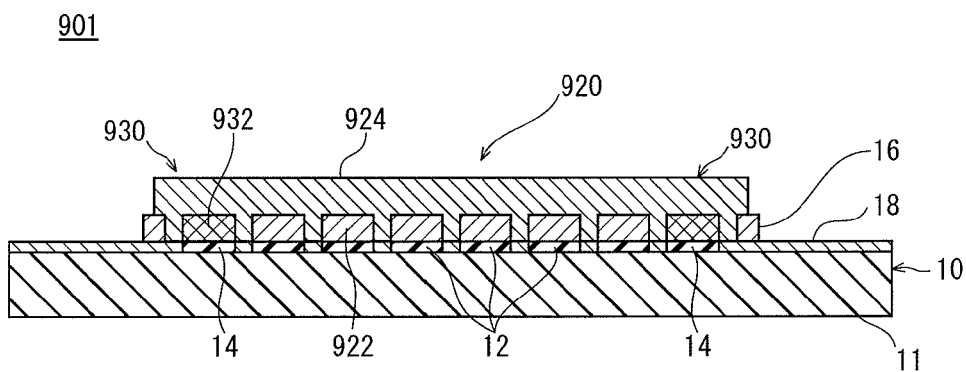
FIGS. 17A and 17B are sectional views showing important parts of light-emitting devices according to yet another two different modifications.

FIG. 17A is a sectional view showing important parts of a light-emitting device 901 according to this modification. Note that components similar to those described in Embodiment 1 are denoted by the same reference signs and descriptions thereof are omitted appropriately.

The light-emitting device 901 is generally identical in structure to the light-emitting device according to Embodiment 1. Yet, the light-emitting device 901 includes the LED chips 922 and 932 instead of the LED chips 22 and 32 all of which are of the same type. Also, the light-emitting device 901 includes a transmissive material encapsulating all of the LED chips 922 and 932, instead of the first wavelength converter 24 and the second wavelength converter 34.

The plurality of LED chips 922 are disposed in the first mounting area AR1 (see FIG. 2A) on the mounting substrate 10, whereas the plurality of LED chips 932 are disposed in the second mounting area AR2 (see FIG. 2A) on the mounting substrate 10. These LED chips 922 and 932 are all encapsulated by an optical component made of a transmissive material, such as silicone resin. The LED chips 922 emit white light of the first color temperature, whereas the LED chips 932 emit white light of the second color temperature. The plurality of LED chips 922 constitute the first light-emitting portion 920, whereas the plurality of LED chips 932 constitute the second light-emitting portion 930.

(7) Embodiment 1 described above is directed to the light-emitting device 1 in which the first light-emitting portion 20 includes one first wavelength converter 24 that encapsulate all the LED chips 22 (18 LED chips in the example shown in FIG. 2A). Also, each second light-emitting portion 30 includes one second wavelength converter 34 that encapsulate all the LED chips 32 (three LED chips in the example shown in FIG. 2A). Alternatively, however, the first light-emitting portion 20 may include a plurality of first wavelength converters separately encapsulating the individual LED chips 22, and the second light-emitting portion 30 includes a plurality of second wavelength converters separately encapsulating the individual LED chips 32.

Figure 17B:
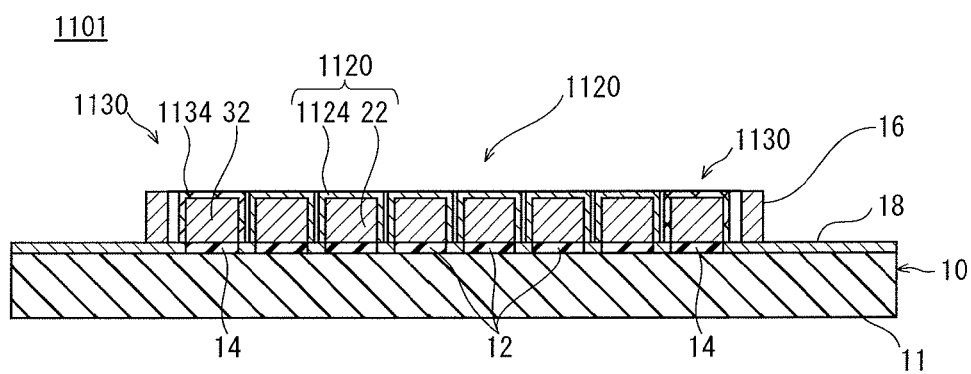

FIG. 17B is a sectional view showing important parts of a light-emitting device 1101 according to this modification.

The light-emitting device 1101 is generally identical in structure to the light-emitting device according to Embodiment 1. Yet, the light-emitting device 1101 includes a plurality of first wavelength converters 1124 separately encapsulating the LED chips disposed in the first mounting area AR1 (see FIG. 2A) of the mounting substrate 10. In addition, the light-emitting device 1101 includes a plurality of second wavelength converters 1134 separately encapsulating the LED chips disposed in the second mounting area AR2 (see FIG. 2A) of the mounting substrate 10. The plurality of LED chip 22 separately encapsulated in the respective first wavelength converter 1124 constitute the first light-emitting portion 1120, whereas the plurality of LED chips 32 separately encapsulated in the respective second wavelength converter 1134 constitute the second light-emitting portion 1130.

(8) According to each of Embodiments 1 and 2, the first light-emitting portion 20 and the second light-emitting portions 30: include the LED chips 22 and 32 of Chip-on-Board (COB) type; and the first wavelength converter 24 and the second wavelength converter 34 encapsulating the LED chips 22 and 32. However, this is merely one example and without limitation. For example, each of the first light-emitting portion 20 and the second light-emitting portions 30 may include one or more LED packages of SMD (Surface Mount Device)

type. This modification also achieves the same advantageous effects as those achieved by Embodiments 1 and 2.

When LED packages of SMD type are employed, each LED package of the first light-emitting portion 20 includes LED chips 22 and a first wavelength converter, whereas each LED package of the second light-emitting portion 30 includes LED chips 32 and a second wavelength converter.

In addition, in the case where the LED packages of SMD are employed, the mounting areas of the first light-emitting portion 20 and the second light-emitting portions 30 can be adjusted simply by changing the mounting positions of the LED packages, without the need to change the positions of the wavelength converters.

Note, however, that the first wavelength converter is not necessarily contained in each LED package of the first light-emitting portion 20. Alternatively, the first wavelength converter may be located at a light-emitting side of the LED chips 22. Similarly, each second wavelength converter is not necessarily contained in each LED package of the second light-emitting portion 30. Alternatively, the second wavelength converter may be located at a light-emitting side of the LED chips 32.

(9) Embodiment 1 described above is directed to the light-emitting device 1 in which the first light-emitting portion and the second light-emitting portions use yellow phosphor, green phosphor, and orange phosphor in combination. Naturally, however, the types of phosphors used are not limited to these phosphors. For example, blue phosphor, blue-green phosphor, and red phosphor may be used in combination.

Suitable examples of blue phosphors include aluminate phosphors, such as $BaMgAl_{10}O_{17}:Eu^{2+}$, halophosphate phosphors, such as $(Sr,Ba)_{10}(PO_4)_6Cl_2:Eu^{2+}$ and $Sr_{10}(PO_4)_6Cl_2:Eu^{2+}$, and silicate phosphors, such as $Ba_3MgSi_2O_8:Eu^{2+}$.

Suitable examples of green phosphors include aluminate phosphors, such as $Sr_4Al_{14}O_{25}:Eu^{2+}$, and silicate phosphors, such as $Sr_2Si_3O_8.2SrCl_2:Eu^{2+}$.

Suitable examples of red phosphors include thiogallate, which is a type of sulfide phosphors, such as $(Sr,Ca)S:Eu^{2+}$, and $La_2O_2S:Eu^{3+},Sm^{3+}$, silicate phosphors, such as $Ba_3MgSi_2O_8:Eu^{2+}:Mn^{2+}$, nitride phosphors, such as $CaAlSiN_3:Eu^{2+}$, $(Ca,Sr)SiN_2:Eu^{2+}$, and $(Ca,Sr)AlSiN_3:Eu^{2+}$, and oxynitride phosphors, such as $Sr_2Si_{5-x}Al_xO_xN_{8-x}:Eu^{2+}$ ($0 \leq x \leq 1$), and $Sr_2(Si,Al)_5(N,O)_8:Eu^{2+}$.

(10) Embodiment 2 described above is directed to the headlamp 1001 in which the power supply unit 1040 includes the first power supply circuit 1044 for supplying power to the first light-emitting portion 20 and the second power supply circuit 1046 for supplying power to the second light-emitting portions 30. That is, power supply to the first light-emitting portion 20 and to the second light-emitting portions 30 can be separately controlled. Alternatively, however, it is applicable to collectively supply power to the first light-emitting portion 20 and the second light-emitting portions 30. In this modification, the LED chips 22 included in the first light-emitting portion 20 and the LED chips 32 included in the respective second light-emitting portions 30 are all connected to the same closed circuit.

The advantage of this modification is that the circuitry of the power supply device 1040 is simplified.

(11) Embodiment 2 described above is directed to the headlamp 1001 that is provided with the light-emitting device 1 including the first light-emitting portion 20 that emits light of the first color temperature and the second light-emitting portions 30 that emits light of the second color temperature. However, the light-emitting device 1 used in the headlamp it not limited to one having two different types of light-emitting portions. For example, a system including a plurality of headlamps each provided with a light-emitting device with a single type of light-emitting portion may be usable.

FIG. 18A is a partly-broken oblique view of an illumination system 3001 according to this modification. FIG. 18B is an oblique view of light-emitting devices 1201A and 1201B included in headlamps 1001A and 1001B, respectively. Note that components similar to those described in Embodiments 1 and 2 are denoted by the same reference signs and descriptions thereof are omitted appropriately.

The illumination system 3001 includes: two headlamps 1001A that emit light of the first color temperature; two headlamps 1001B that emit light of the second color temperature; and a base 3010 on which the respective headlamps are mounted. Each headlamp 1001A has a light-emitting device 1201A that emits light of the first color temperature. Each headlamp 1001B has a light-emitting device 1201B that emits light of the second color temperature.

The two headlamps 1001A are disposed next to each other. The two headlamps 1001B are disposed to have the two headlamps 1001A between them in the direction in which the headlamps 1001A are adjacent.

Each light-emitting device 1201A includes a light-emitting portion 1220A that emits light of only one color temperature, and each light-emitting device 1201B includes a light-emitting portion 1220B that emits light of only one color temperature.

Each first light-emitting portion 1220A emits light of the first color temperature. The light of the first color temperature refers to white light of color temperatures ranging from 2000 K to 5500 K.

Each second light-emitting portion 1220B emits light of the second color temperature that is higher than the first color temperature. The light of the second color temperature refers to white light of color temperatures ranging from higher than 5500 K to 20000 K or lower.

The following describes the light distribution characteristics of the illumination system 3001 according to this modification.

Figure 19:
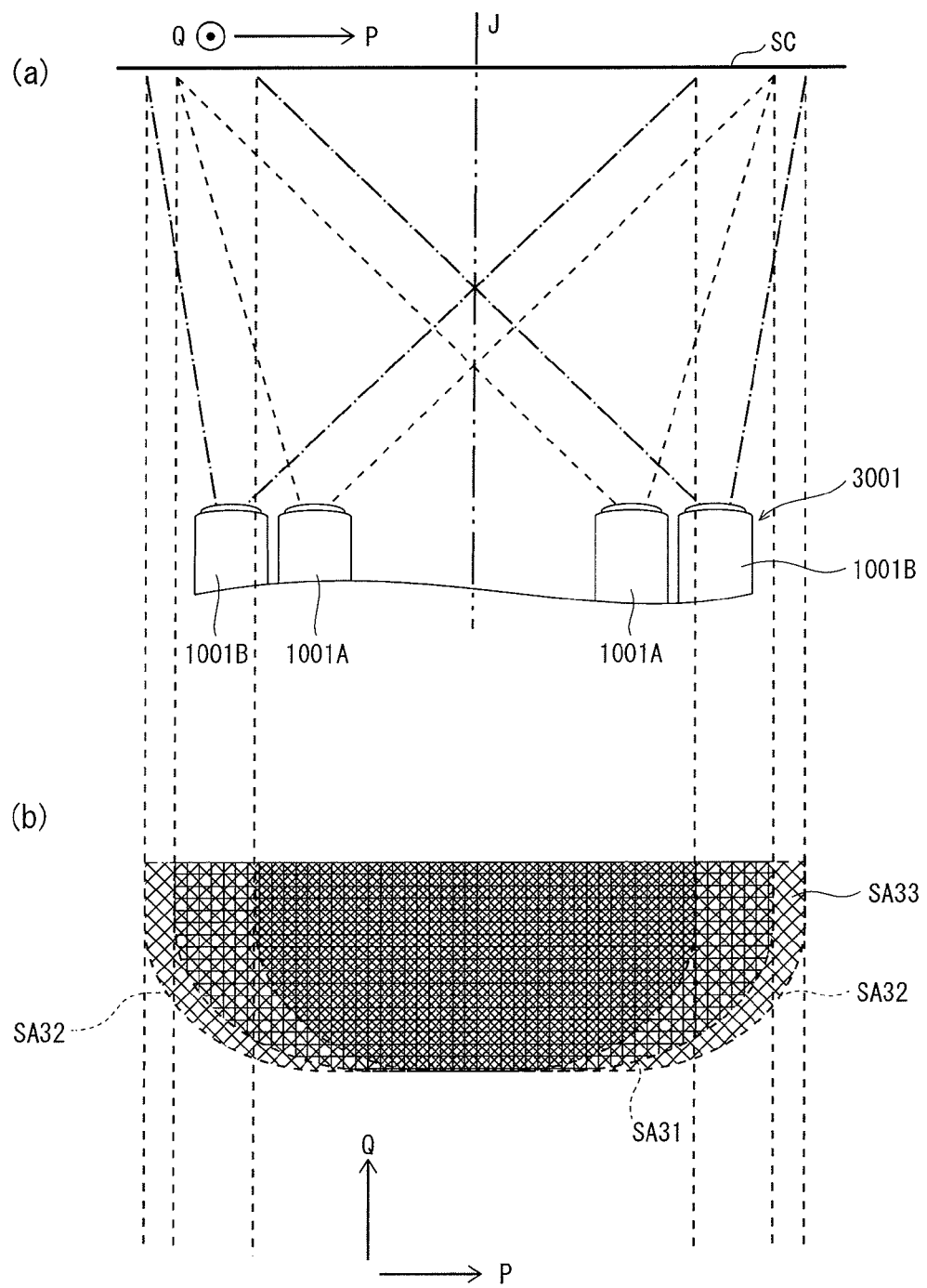
FIG. 19 is a view explaining the light distribution characteristics of the illumination system according to the modification.
Figure 20:
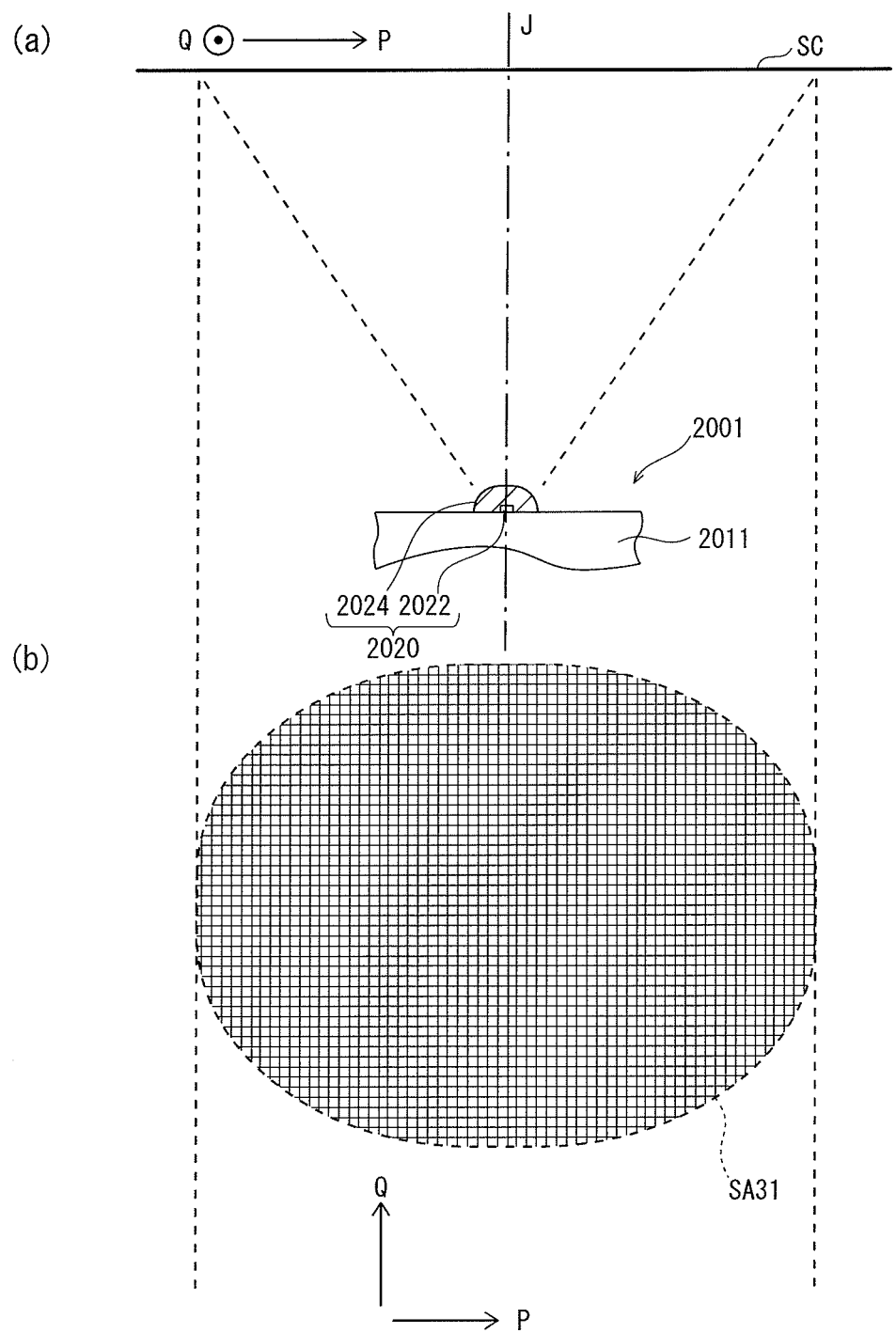
FIG. 20 is a view explaining the light distribution characteristics of a conventional light-emitting device.

FIG. 19 is a view explaining the light distribution characteristics of the illumination system 3001. In the portion (a) of FIG. 19, the P-axis direction refers to the direction toward right along the drawing sheet surface, whereas the Q-axis direction refers to the direction perpendicular to the drawing sheet surface and toward the viewer of the figure. In the portion (b) of FIG. 19, the P-axis direction refers to the direction toward right along the drawing sheet surface, whereas the Q-axis direction refers to the upward direction in the figure. In addition, the Q-axis direction matches the direction reverse to the vertical direction.

As shown in the portion (a) of FIG. 19, suppose that the screen SC is disposed ahead of the illumination system 3001. Then, as the portion (b) of FIG. 19 shows, light emitted from the headlamps 1001A irradiates the first irradiation area SA31 (hatched area with lengthwise and widthwise lines) of the screen SC, whereas light emitted from the headlamps 1001B irradiates the second irradiation areas SA32 (hatched areas with diagonal lines) of the screen SC. The second irradiation areas SA32 each partially overlap the first irradiation area SA1 and include part of a region surrounding the first irradiation area SA1. Consequently, of each of the second irradiation areas SA32, the part not overlapping the first irradiation area SA31 (the non-overlapping part may also be referred to as the "third irradiation area" SA33) exhibits higher color temperature than that of the first irradiation area SA31.

REFERENCE SIGN LIST 1 light-emitting unit
201, 301, 401, 501, 601, 701, 801, 901, 1101 light-emitting device
10, 210, 310, 410, 510 mounting substrate
11, 56 insulating substrate
12 conductor pattern
16 frame
17, 924 optical component
18, 58 reflective film
19, 59 adhesive sheet
20, 220, 320, 420, 520, 820, 920, 1120 first light-emitting portion
22, 32, 922, 932 LED chip
24, 824, 1124 first wavelength converter
30, 230, 330, 430, 530, 630, 830, 930, 1130 second light-emitting portion
34, 634, 734, 834, 1134 second wavelength converter
40 heat transfer plate
42a, 42b, 53a, 53b through hole
50 circuit board
52a window
54 wiring pattern
54a electrode pad
54b extension
60 metal wire
62 seal
634a tapered surface
1001 headlamp
1010 housing
1011 body
1011a cylindrical tubular portion
1011b first wall
1011c second wall
1011d opening
1011e plane
1012 closure plate
1020 reflector plate
1025 light-shielding plate
1030 projecting lens
1040 power supply unit
1042 power line
1044 first power supply circuit
1046 second power supply circuit
1050 support
AR1, AR201, AR301, AR401, AR501, AR801 first mounting area
AR2, AR202, AR302, AR402, AR502, AR802 second mounting area
SA1, SA21 first irradiation area
SA2, SA22 second irradiation area

The invention claimed is:

1. A light-emitting device comprising:
a substrate;
a first light-emitting portion disposed on the substrate in a first mounting area of the substrate and configured to emit light of a first color temperature to irradiate a first irradiation area of a target; and
a second light-emitting portion disposed on the substrate in a second mounting area of the substrate and configured to emit light of a second color temperature to irradiate a second irradiation area of the target, the second mounting area including at least part of a region surrounding the first mounting area, the second color temperature being higher than the first color temperature, and the second irradiation area partially overlapping the first irradiation area and including at least part of a region surrounding the first irradiation area,
wherein an optical axis of the first light-emitting portion is parallel to an optical axis of the second light-emitting portion,
the first light-emitting portion includes:
a first light-emitting element disposed in the first mounting area and configured to emit light in a first wavelength range; and
a first wavelength converter disposed to encapsulate the first light-emitting element in the first mounting area and configured to convert part of the light in the first wavelength range emitted by the first light-emitting element to light in a second wavelength range that is of longer wavelengths than the first wavelength range,
the first light-emitting portion emits the light of the first color temperature by mixing light in the first wavelength range and light in the second wavelength range both emitted through the first wavelength converter,
the second light-emitting portion includes:
a second light-emitting element disposed in the second mounting area and configured to emit light in the first wavelength range; and
a second wavelength converter disposed to encapsulate the second light-emitting element in the second mounting area and configured to convert part of the light in the first wavelength range emitted by the second light-emitting element to light in the second wavelength range, and
at least part of the second wavelength converter is thinner than the first wavelength converter in a main emission direction of light from the respective light-emitting elements, the main emission direction being perpendicular to the respective mounting areas of the substrate,
the second wavelength converter emits the light of the second color temperature by mixing light in the first wavelength range and light in the second wavelength range both emitted through the second wavelength converter, and
the thickness of the second wavelength converter in the main emission direction is gradually decreased toward a location away from a boundary between the first light-emitting portion and the second light-emitting portion.

2. The light-emitting device according to claim 1, wherein
the second mounting area comprises two second mounting areas that are on opposite sides of the first mounting area so as to have a central part of the first mounting area between the two second mounting areas, and
the second light-emitting portion comprises two second light-emitting portions that are respectively disposed in the two second mounting areas.

3. The light-emitting device according to claim 1, wherein the second mounting area annularly surrounds the first mounting area.

4. The light-emitting device according to claim 1, wherein
the first wavelength converter is configured to convert part of the light in the first wavelength range emitted by the first light-emitting element to light in a first portion of the second wavelength range that is of longer wavelengths than the first wavelength range,
the first light-emitting portion emits the light of the first color temperature by mixing light in the first wavelength range and light in the first portion of the second wavelength range both emitted through the first wavelength converter, the second wavelength converter is configured to convert part of the light in the first wavelength range emitted by the second light-emitting element to light in a second portion of the second wavelength range that is of wavelengths longer than the first wavelength range and shorter than the first portion of the second wavelength range, and the second light-emitting portion emits the light of the second color temperature by mixing light in the first wavelength range and light in the second portion of the second wavelength range both emitted through the second wavelength converter.

5. The light-emitting device according to claim 1, wherein the second wavelength converter is lower than the first wavelength converter in wavelength conversion efficiency.

6. The light-emitting device according to claim 1, wherein the first light-emitting portion includes at least one third light-emitting element disposed in the first mounting area and configured to emit light of the first color temperature, and the second light-emitting portion includes at least one fourth light-emitting element disposed in the second mounting area and configured to emit light of the second color temperature.

7. An illumination system comprising:
the light-emitting device of claim 1; and
a light-distributor configured to distribute light emitted from the light-emitting device to a target area.

8. The illumination system according to claim 7, wherein the light-distributor includes:
a reflector plate configured to reflect light from the light-emitting device toward the target area; and
a lens configured to collect light reflected by the reflector plate.

9. An on-vehicle headlamp, comprising the illumination system of claim 7.

10. An illumination system comprising:
the light-emitting device of claim 1; and
a power supply configured to supply power to cause the first light-emitting portion and the second light-emitting portion to emit light.

11. The illumination system according to claim 10, wherein the power supply includes:
a first power supply circuit configured to supply power to the first light-emitting portion; and
a second power supply circuit configured to supply power to the second light-emitting portion.

* * * * *